(12) United States Patent
Ikeda

(10) Patent No.: US 7,791,341 B2
(45) Date of Patent: Sep. 7, 2010

(54) IMAGE GENERATING METHOD, POSITION CORRECTING METHOD AND MAGNETIC RESONANCE IMAGING APPARATUS

(75) Inventor: Hitoshi Ikeda, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 50 days.

(21) Appl. No.: 12/139,357

(22) Filed: Jun. 13, 2008

(65) Prior Publication Data

US 2008/0309334 A1 Dec. 18, 2008

(30) Foreign Application Priority Data

Jun. 14, 2007 (JP) ............................. 2007-158014

(51) Int. Cl.
G01V 3/00 (2006.01)
(52) U.S. Cl. ..................................................... 324/309
(58) Field of Classification Search ......... 324/300–322; 600/410–435
See application file for complete search history.

(56) References Cited

U.S. PATENT DOCUMENTS

| | | | |
|---|---|---|---|
| 5,166,875 A | 11/1992 | Machida | |
| 5,275,164 A | 1/1994 | Maeda et al. | |
| 6,949,928 B2 | 9/2005 | Gonzalez Ballester et al. | |
| 7,218,108 B2 | 5/2007 | Ichinose et al. | |
| 7,288,937 B2 | 10/2007 | Nabetani | |
| 7,375,523 B1 | 5/2008 | Hancu | |
| 2004/0070394 A1 | 4/2004 | Gonzalez Ballester et al. | |
| 2005/0151538 A1 | 7/2005 | Ichinose et al. | |

FOREIGN PATENT DOCUMENTS

JP 2005-198715 7/2005

*Primary Examiner*—Brij B Shrivastav
*Assistant Examiner*—Dixomara Vargas
(74) *Attorney, Agent, or Firm*—Armstrong Teasdale LLP

(57) ABSTRACT

A method for generating an image, based on a plurality of magnetic resonance signals received and obtained by a plurality of RF coils by scanning a subject lying within a static magnetic field space by the RF coils in accordance with a parallel imaging method, including: a first step for selecting a reference magnetic resonance signal used as a reference from the magnetic resonance signals, based on profiles of the magnetic resonance signals; a second step for calculating a frequency difference corresponding to a difference between a frequency maximum in signal intensity at the reference magnetic resonance signal selected at the first step, and a frequency at the center of a k space; a third step for setting the frequency difference calculated at the second step as a displacement for displacing all the magnetic resonance signals, and displacing the magnetic resonance signals, based on the displacement; and a fourth step for executing half echo processing on the magnetic resonance signals displaced at the third step.

20 Claims, 30 Drawing Sheets

C1    C2    C3

141

(PRIOR ART)
FIG. 30
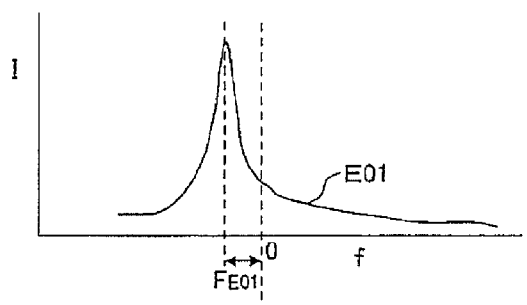
(a)
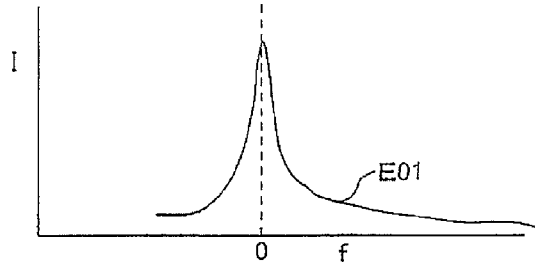
(b)
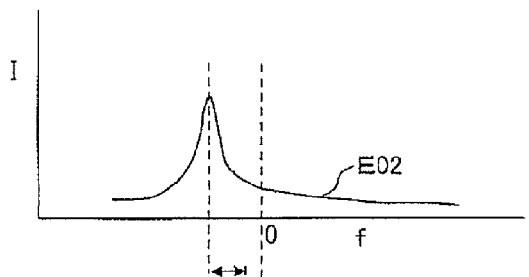
(c)
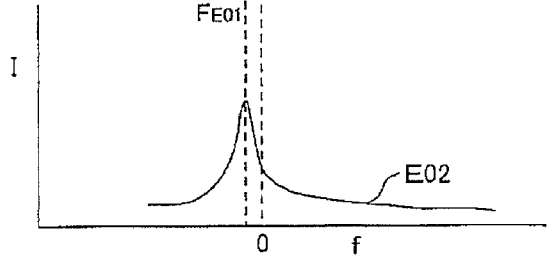
(d)
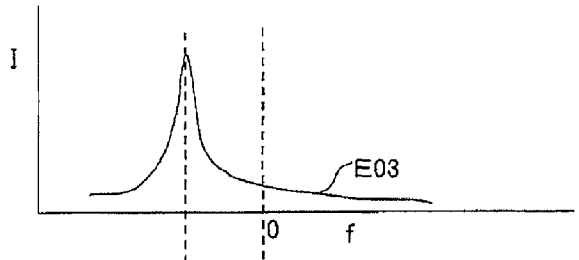
(e)
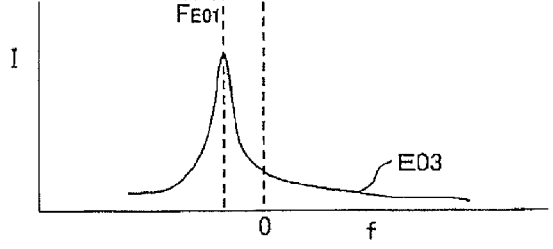
(f)

IMAGE GENERATING METHOD, POSITION CORRECTING METHOD AND MAGNETIC RESONANCE IMAGING APPARATUS

CROSS REFERENCE TO RELATED APPLICATIONS

This application claims the benefit of Japanese Patent Application No. 2007-158014 filed Jun. 14, 2007, which is hereby incorporated by reference in its entirety.

BACKGROUND OF THE INVENTION

The subject matter disclosed herein relates to a magnetic resonance image generating method, a method for correcting the positions of magnetic resonance signals, and a magnetic resonance imaging apparatus.

A magnetic resonance imaging apparatus is an apparatus for generating magnetic resonance signals using a nuclear magnetic resonance phenomenon and photographing or imaging a tomographic image of a subject.

Since time is required for imaging in the magnetic resonance imaging apparatus, attempts to shorten the imaging time have been made by various methods.

There are known, for example, a half echo method for acquiring or collecting data slightly greater than half of generated echo signals utilizing the symmetry of an echo waveform relative to an echo time interval and the symmetry of k-space data in a frequency direction and calculating the remaining portions using the conjugate symmetry, a parallel imaging method for executing a phase encode-thinned sequence using a phased array coil comprised of a plurality of RF coils different in sensitivity distribution and performing a development process for removing wrap-around artifacts by matrix operation, thereby shortening an imaging time interval, etc. (refer to, for example, Japanese Unexamined Patent Publication No. 2005-198715).

In the half echo method, homodyne processing is executed to make up for missing data. In order to execute the homodyne processing, it is carried out by allowing the center of each echo signal to pass through a high pass filter and a low pass filter. Since the high pass filter and the low pass filter are placed in the center of a k space, there is a need to displace the center of an echo signal shifted from the center of the k space to the center of the k space. Since the peak of each echo signal is normally taken as the center of the echo signal, the peak of the echo signal is displaced to the center of the k space.

Due to influences such as non-uniformity of a rotating magnetic field (B1), however, the peaks of a plurality of echo signals received by a phased array coil do not necessarily coincide. Assuming that a plurality of echo signals received from a plurality of RF coils constituting a phased array coil are echo signals E01, E02 and E03 as shown in FIGS. 29(a)-29(f), for example, the peaks of the respective echo signals are respectively shifted from the center O of a k space by frequencies different from frequencies $F_{E01}$, $F_{E02}$ and $F_{E03}$. Therefore, there is a need to displace the echo signals with different displacements for the purpose of displacing the peaks of the received echo signals to the frequency axial center O in the k space.

In the parallel imaging method, a relationship of phase between sensitivity distributions of coils at a calibration scan and an actual scan gets out of order when all echo signals are not displaced with the same displacement in a k space, thus leading to the occurrence of artifacts. Therefore, when the half echo method and the parallel imaging method are utilized in combination, an RF coil for a channel set as the reference is selected, and a displacement for displacing the peak of an echo signal received by the selected RF coil to the frequency axial center O in the k space is applied to all echo signals, whereby centering processing is executed on all the echo signals. Assuming that the echo signal received by the RF coil for the channel set as the reference is an echo signal E01 as shown in FIGS. 30(a)-30(f), for example, the echo signals E01, E02 and E03 are displaced to execute centering processing with a frequency $F_{E01}$ as a displacement for displacing the peak of the echo signal E01 to the frequency axial center O in the k space.

Now, since imaging by the parallel imaging method has extended from local regions such as the head to a wide range of portions or regions such as the abdomen, the plural RF coils that constitute the phased array coil have been brought to multichanneling. Therefore, the difference between the signal intensities at the echo signals received by the RF coils that constitute the phased array coil has been brought to the fore.

When an echo signal low in signal intensity is affected by noise or the like as shown in FIGS. 31(a) and 31(b), the maximum value of the signal intensity thereof becomes a noise portion, and both the maximum value thereof and its peak P might not coincide with each other. Thus, when an RF coil for receiving the echo signal low in signal intensity is selected as a reference coil where it is affected by noise or the like, the noise portion of the echo signal is judged to be its maximum value. Therefore, a displacement for executing centering processing on all echo signals is calculated based on this echo signal. When all the echo signals are displaced based on the displacement, the actual peak P of the echo signal is not displaced to a frequency axial center O in a k space over all the echo signals, and a portion shifted from the actual peak P is displaced to the frequency axial center O in the k space. Therefore, artifacts might occur in a generated image.

BRIEF DESCRIPTION OF THE INVENTION

The invention provides an echo signal position correcting method, an image generating method and a magnetic imaging apparatus such as to avoid the occurrence of artifacts in a generated image when the half echo method and the parallel imaging method are utilized in combination.

The invention provides a method for generating an image, based on a plurality of magnetic resonance signals received and obtained by a plurality of RF coils by scanning a subject lying within a static magnetic field space by the RF coils in accordance with a parallel imaging method, including a first step for selecting a reference magnetic resonance signal used as a reference from the magnetic resonance signals, based on profiles of the magnetic resonance signals, a second step for calculating a frequency difference corresponding to a difference between a frequency maximum in signal intensity at the reference magnetic resonance signal selected at the first step, and a frequency at the center of a k space, a third step for setting the frequency difference calculated at the second step as a displacement for displacing all the magnetic resonance signals, and displacing the magnetic resonance signals, based on the displacement, and a fourth step for executing half echo processing on the magnetic resonance signals displaced at the third step.

Preferably, the first step calculates the maximum value of signal intensities of the magnetic resonance signals and selects the magnetic resonance signal largest in the maximum value within all the magnetic resonance signals as the reference magnetic resonance signal.

Preferably, the first step calculates an integral value of each of the magnetic resonance signals and selects the magnetic resonance signal maximum in the integral value within the magnetic resonance signals as the reference magnetic resonance signal.

Preferably, the first step calculates correlation coefficients between the magnetic resonance signals with respect to the magnetic resonance signals and selects the magnetic resonance signal maximum in the average value of the correlation coefficients within the magnetic resonance signals as the reference magnetic resonance signal.

The invention provides a method for generating an image, based on a plurality of magnetic resonance signals received and obtained by a plurality of RF coils by scanning a subject lying within a static magnetic field space by the RF coils in accordance with a parallel imaging method, including a first step for calculating frequency difference corresponding to differences between frequencies maximum in signal intensity with respect to the magnetic resonance signals, and a frequency at the center of a k space, and calculating an average value of the frequency differences, a second step for setting the average value of the frequency differences calculated at the first step as a displacement for displacing all the magnetic resonance signals, and displacing the magnetic resonance signals, based on the displacement respectively, and a third step for executing half echo processing on the magnetic resonance signals displaced at the second step.

The invention provides a method for generating an image, based on a plurality of magnetic resonance signals received and obtained by a plurality of RF coils by scanning a subject lying within a static magnetic field space by the RF coils in accordance with a parallel imaging method, including a first step for calculating differences between frequencies maximum in signal intensity with respect to the magnetic resonance signals and a frequency at the center of a k space, and profile characteristics of the magnetic resonance signals, and calculating an average value of the products of the frequency differences and the profile characteristics, a second step for setting the average value calculated at the first step as a displacement for displacing all the magnetic resonance signals, and displacing the magnetic resonance signals, based on the displacement respectively, and a third step for executing half echo processing on the magnetic resonance signals displaced at the second step.

Preferably, the profile characteristics of the magnetic resonance signals are integral values of the magnetic resonance signals.

Preferably, the profile characteristics of the magnetic resonance signals are maximum values of signal intensities of the magnetic resonance signals.

The invention provides a method for generating an image, based on a plurality of magnetic resonance signals received and obtained by a plurality of RF coils by scanning a subject lying within a static magnetic field space by the RI coils in accordance with a parallel imaging method, including a first step for calculating frequency differences between frequencies maximum in signal intensity with respect to the magnetic resonance signals, and a frequency at the center of a k space, a second step for setting the frequency differences as displacements for displacing median values of the frequency differences and displacing the magnetic resonance signals, based on the displacements, and a third step for executing half echo processing on the magnetic resonance signals displaced at the second step.

The invention provides a method for generating an image, based on a plurality of magnetic resonance signals received and obtained by a plurality of RF coils by scanning a subject lying within a static magnetic field space by the RF coils in accordance with a parallel imaging method, including a first step for calculating frequency differences between frequencies maximum in signal intensity with respect to the magnetic resonance signals, and a frequency at the center of a k space, and calculating standard deviations of the frequency differences, a second step for selecting a plurality of reference frequency differences each set as a reference from the frequency differences calculated with respect to the magnetic resonance signals, based on the standard deviations calculated at the first step, and calculating an average value of the selected reference frequency differences, a third step for setting the average value calculated at the second step as a displacement for displacing all the magnetic resonance signals, and displacing the magnetic resonance signals, based on the displacement respectively, and a fourth step for executing half echo processing on the magnetic resonance signals displaced at the third step.

The invention provides a position correcting method for displacing a plurality of magnetic resonance signals respectively received and obtained by a plurality of RF coils by scanning a subject lying within a static magnetic field space by the RF coils in accordance with a parallel imaging method, the position correcting method being suitable for use in a method for executing half echo processing on the magnetic resonance signals thereby to generate an image, the position correcting method including a first step for selecting a reference magnetic resonance signal used as a reference from the magnetic resonance signals, based on profiles of the magnetic resonance signals, a second step for calculating a frequency difference corresponding to a difference between a frequency maximum in signal intensity at the reference magnetic resonance signal selected at the first step, and a frequency at the center of a k space, and a third step for setting the frequency difference calculated at the second step as a displacement for displacing all the magnetic resonance signals, and displacing the magnetic resonance signals, based on the displacement respectively.

Preferably, the first step calculates the maximum value of signal intensities of the magnetic resonance signals and selects the magnetic resonance signal largest in the maximum value within all the magnetic resonance signals as the reference magnetic resonance signal.

Preferably, the first step calculates an integral value of each of the magnetic resonance signals and selects the magnetic resonance signal maximum in the integral value within all the magnetic resonance signals as the reference magnetic resonance signal.

Preferably, the first step calculates correlation coefficients between the magnetic resonance signals with respect to the magnetic resonance signals and selects the magnetic resonance signal maximum in the average value of the correlation coefficients within the magnetic resonance signals as the reference magnetic resonance signal.

The invention provides a position correcting method for displacing a plurality of magnetic resonance signals respectively received and obtained by a plurality of RF coils by scanning a subject lying within a static magnetic field space by the RF coils in accordance with a parallel imaging method, the position correcting method being suitable for use in a method for executing half echo processing on the magnetic resonance signals thereby to generate an image, the position correcting method including a first step for calculating frequency differences corresponding to differences between frequencies maximum in signal intensity with respect to the magnetic resonance signals, and a frequency at the center of a k space, and calculating an average value of the frequency differences, and a second step for setting the average value calculated at the first step as a displacement for displacing all the magnetic resonance signals, and displacing the magnetic resonance signals, based on the displacement.

The invention provides a position correcting method for displacing a plurality of magnetic resonance signals respectively received and obtained by a plurality of RF coils by scanning a subject lying within a static magnetic field space by the RF coils in accordance with a parallel imaging method, the position correcting method being suitable for use in a method for executing half echo processing on the magnetic resonance signals thereby to generate an image, the position correcting method including a first step for calculating frequency differences between frequencies maximum in signal intensity with respect to the magnetic resonance signals, and a frequency at the center of a k space, and profile characteristics of the magnetic resonance signals, and calculating an average value of the products of the frequency differences and the profile characteristics, and a second step for setting the average value calculated at the first step as a displacement for displacing all the magnetic resonance signals, and displacing the magnetic resonance signals, based on the displacement.

Preferably, the profile characteristics of the magnetic resonance signals arc integral values of the magnetic resonance signals.

Preferably, the profile characteristics of the magnetic resonance signals are maximum values of signal intensities of the magnetic resonance signals.

The invention provides a position correcting method for displacing a plurality of magnetic resonance signals respectively received and obtained by a plurality of RF coils by scanning a subject lying within a static magnetic field space by the RF coils in accordance with a parallel imaging method, the, position correcting method being suitable for use in a method for executing half echo processing on the magnetic resonance signals thereby to generate an image, the position correcting method including a first step for calculating frequency differences between frequencies maximum in signal intensity with respect to the magnetic resonance signals, and a frequency at the center of a k space, and a second step for setting the frequency differences as displacements for displacing median values of the frequency differences calculated at the first step, and displacing the magnetic resonance signals, based on the displacements.

The invention provides a position correcting method for displacing a plurality of magnetic resonance signals respectively received and obtained by a plurality of RF coils by scanning a subject lying within a static magnetic field space by the RF coils in accordance with a parallel imaging method, the position correcting method being suitable for use in a method for executing half echo processing on the magnetic resonance signals thereby to generate an image, the position correcting method including a first step for calculating frequency differences between frequencies maximum in signal intensity with respect to the magnetic resonance signals, and a frequency at the center of a k space, and calculating standard deviations of the frequency differences, a second step for selecting a plurality of reference frequency differences each set as a reference from the frequency differences calculated with respect to the magnetic resonance signals, based on the standard deviations calculated at the first step, and calculating an average value of the selected reference frequency differences, and a third step for setting the average value calculated at the second step as a displacement for displacing all the magnetic resonance signals, and displacing the magnetic resonance signals, based on the displacement respectively.

The invention provides a magnetic resonance imaging apparatus for generating an image, based on a plurality of magnetic resonance signals received and obtained by a plurality of RF coils by scanning a subject lying within a static magnetic field space by the RF coils in accordance with a parallel imaging method, including a scan section which applies RF pulses to the subject and receives the magnetic resonance signals therein, a displacement calculating part which selects a reference magnetic resonance signal used as a reference from the magnetic resonance signals received by the scan section, based on profiles of the magnetic resonance signals, calculates a frequency difference corresponding to a difference between a frequency maximum in signal intensity at the selected reference magnetic resonance signal, and a frequency at the center of a k space, and sets the frequency difference as a displacement for displacing the magnetic resonance signals, a centering executing part which displaces the magnetic resonance signals, based on the displacement calculated by the displacement calculating part to thereby execute centering processing, and an image reconstruction unit which executes half echo processing on the magnetic resonance signals displaced by the centering executing part thereby to generate an image.

Preferably, the displacement calculating part calculates a maximum value of signal intensities of the magnetic resonance signals received by the san section, selects the magnetic resonance signal largest in the maximum value within the magnetic resonance signals as the reference magnetic resonance signal, calculates a frequency difference corresponding to a difference between a frequency maximum in signal intensity at the selected reference magnetic resonance signal, and a frequency at the center of a k space, and sets the frequency difference as a displacement for displacing all the magnetic resonance signals.

Preferably, the displacement calculating part calculates each of integral values of the magnetic resonance signals received by the scan section, selects the magnetic resonance signal maximum in the integral value within the magnetic resonance signals as the reference magnetic resonance signal, calculates a frequency difference corresponding to a difference between a frequency maximum in signal intensity at the selected reference magnetic resonance signal, and a frequency at the center of a k space, and sets the frequency difference as a displacement for displacing all the magnetic resonance signals.

Preferably, the displacement calculating part calculates correlation coefficients between the magnetic resonance signals with respect to the magnetic resonance signals received by the scan section, selects the magnetic resonance signal maximum in the average value of the correlation coefficients calculated every magnetic resonance signals within all the magnetic resonance signals as the reference magnetic resonance signal, calculates a frequency difference corresponding to a difference between a frequency maximum in signal intensity at the selected reference magnetic resonance signal and a frequency at the center of a k space, and sets the frequency difference as a displacement for displacing all the magnetic resonance signals.

Preferably, the displacement calculating part calculates frequency differences corresponding to differences between frequencies maximum in signal intensity with respect to the magnetic resonance signals received by the scan section, and a frequency at the center of a k space, calculates an average value of the frequency differences, and sets the average value thereof as a displacement for displacing all the magnetic resonance signals.

Preferably, the displacement calculating part calculates frequency differences between frequencies maximum in signal intensity with respect to the magnetic resonance signals received by the scan section, and a frequency at the center of a k space and integral values of the magnetic resonance signals, calculates an average value of the products of both the frequency differences and the integral values, and sets the average value thereof as a displacement for displacing all the magnetic resonance signals.

Preferably, the displacement calculating part calculates frequency differences between frequencies maximum in signal intensity with respect to the magnetic resonance signals received by the scan section, and a frequency at the center of a k space, and maximum values of signal intensities of the magnetic resonance signals, calculates an average value of the products of the frequency differences and the maximum values of the signal intensities, and sets the average value thereof as a displacement for displacing all the magnetic resonance signals.

Preferably, the displacement calculating part calculates a frequency difference between a frequency maximum in signal intensity with respect to the magnetic resonance signals received by the scan section, and a frequency at the center of a k space, and sets the same as a displacement for displacing a median value of the frequency difference.

Preferably, the displacement calculating part calculate frequency differences between frequencies maximum in signal intensity with respect to the magnetic resonance signals received by the scan section, and a frequency at the center of a k space, calculates standard deviations of the frequency differences, selects a plurality of reference frequency differences each set as a reference from the frequency differences calculated with respect to the magnetic resonance signals, based on the standard deviations, calculates an average value of the selected reference frequency differences, and sets the average value thereof as a displacement for displacing all the magnetic resonance signals.

According to the invention, there can be provided an image generating method, an echo signal position correcting method and a magnetic imaging apparatus such as to avoid the occurrence of artifacts in a generated image when a half echo method and a parallel imaging method are utilized in combination.

Further objects and advantages of the present invention will be apparent from the following description of the preferred embodiments of the invention as illustrated in the accompanying drawings.

BRIEF DESCRIPTION OF THE DRAWINGS

FIGS. 30(a)-30(f) are diagrams for describing a prior art.

DETAILED DESCRIPTION OF THE INVENTION

A respective one embodiment according to the invention will hereinafter be explained with reference to the accompanying drawings.

Figure 1:
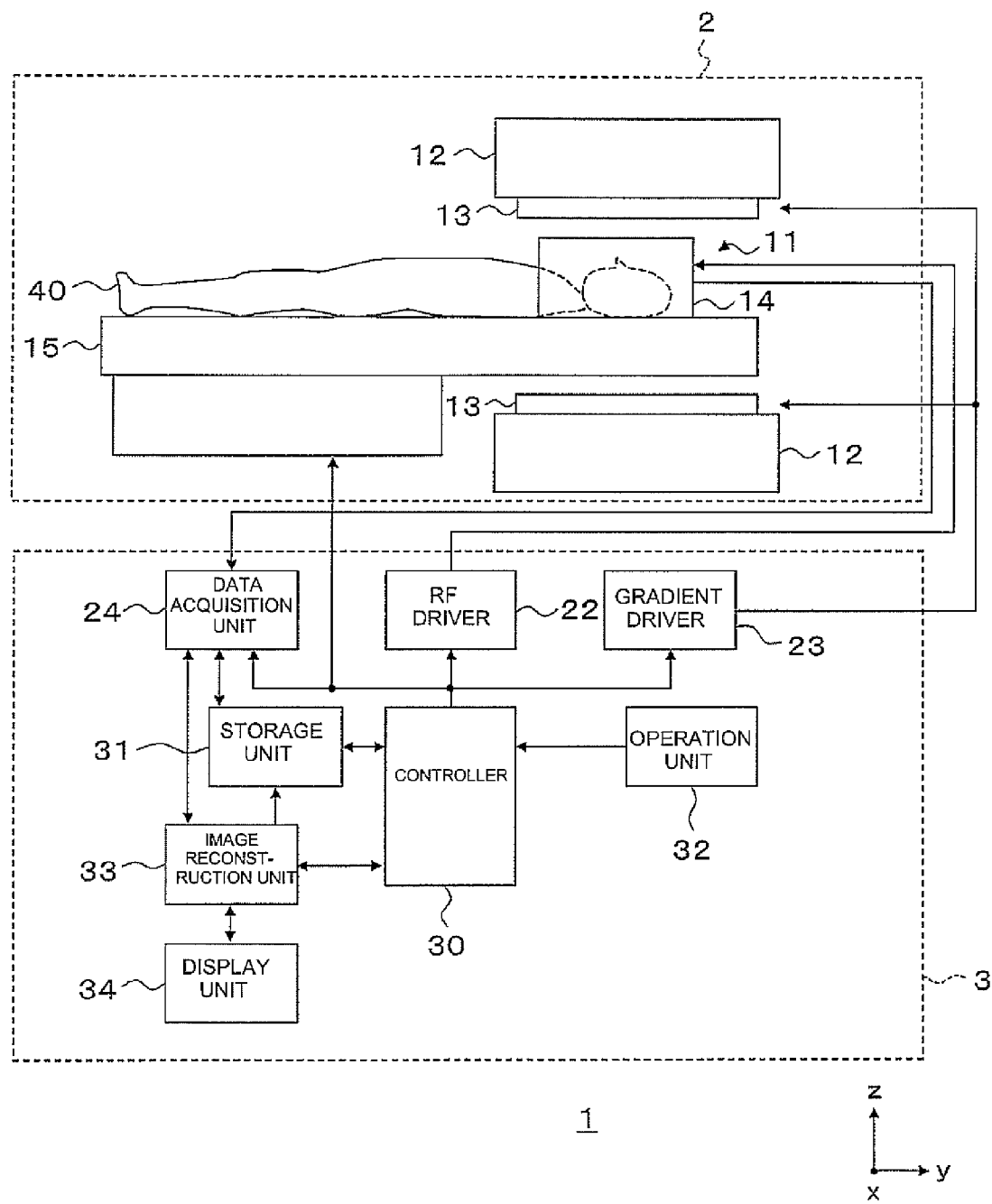
FIG. 1 is a configuration diagram showing a construction of a magnetic resonance imaging apparatus constituted by an RF coil unit of one embodiment according to the invention.

FIG. 1 is a configuration diagram showing a construction of a magnetic resonance imaging apparatus constituted by an RF coil unit in one embodiment according to the invention. The present apparatus is one example of embodiments of the invention.

As shown in FIG. 1, the magnetic resonance imaging apparatus 1 has a scan section 2 and an operation console section 3. Here, the scan section 2 has a static magnetic field magnet unit 12, a gradient coil unit 13, an RF coil unit or part 14 and a cradle 15. And the operation console section 3 has an RE driver 22, a gradient driver 23, a data acquisition unit 24, a controller 30, a storage unit 31, an operation unit 32, an image reconstruction unit 33 and a display unit 34.

As shown in FIG. 1, the scan section 2 includes a static magnetic field space 11 in which an imaging slice area including an imaging target body-moved in a subject 40 is held or accommodated. The scan section 2 applies RF pulses to the corresponding imaging area of the subject 40 held in the static magnetic flied space 1 formed with a static magnetic field, based on a control signal outputted from the operation console unit 3. A scan for acquiring magnetic resonance signals produced from the imaging area as imaging data is executed on the subject 40.

Figure 2:
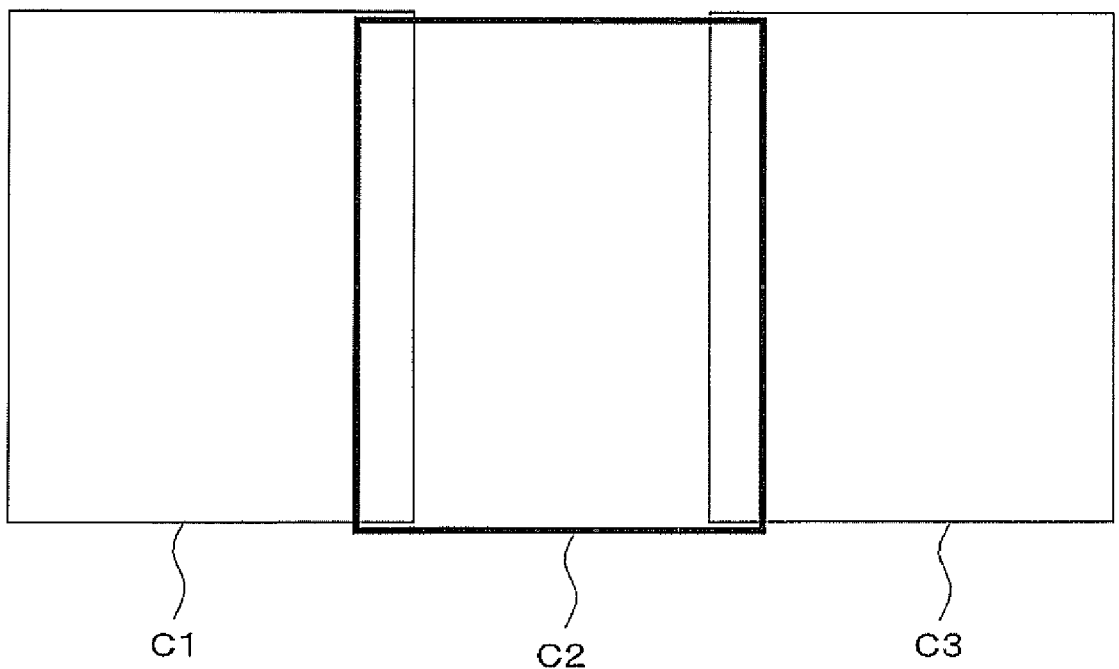
FIG. 2 shows one example of a phased array coil.
Figure 3:
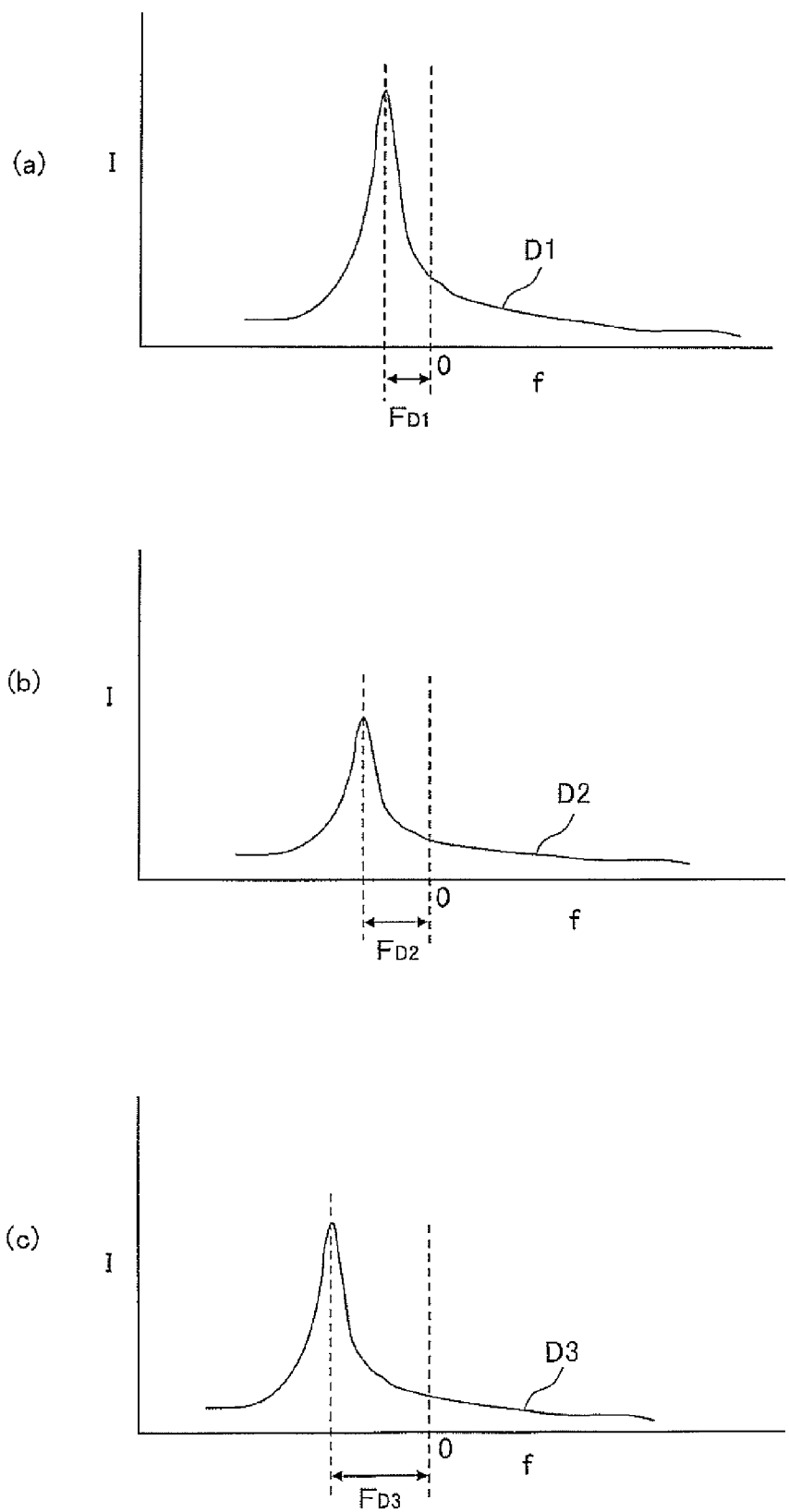
FIGS. 3(a), 3(b), and 3(c) are diagrams showing data obtained by executing Fourier transform processing on echo signals received by the phased array coil.

Respective constituent elements of the scan section 2 will be explained sequentially. FIG. 2 is a diagram showing one example of a phased array coil. For convenience of promotion of understanding, the overlapping of surface coils has been described in slid form, and the thickness of each coil line has been changed. FIGS. 3(a), 3(b), and 3(c) are diagrams showing data obtained by executing Fourier transform processing on echo signals received from the phased array coil. The vertical axis indicates the signal intensity I, and the horizontal axis indicates the frequency f. A broken line indicative of a frequency 0 shows the center O in a k space.

The static magnetic field magnet unit 12 is provided to form the static magnetic field in the static magnetic field space 11 with the subjected 40 held therein. The static magnetic field magnet unit 12 is of a horizontal magnetic field type and forms the static magnetic field through a superconductive magnet (not shown) so as to extend along a body-axis direction (z direction) of the subject 40 placed in the static magnetic field space 11 with the subject 40 accommodated therein. Incidentally, the static magnetic field magnet unit 12 may be of a vertical magnetic field type in addition to the horizontal magnetic field type. Alternatively, the static magnetic field magnet unit 12 may be constituted of a permanent magnet.

The gradient coil unit 13 forms a gradient magnetic field in the static magnetic field space 11 to cause each magnetic resonance signal received by the RF coil unit 14 to have three-dimensional position information. The gradient coil unit 13 has gradient coils of three systems to form three types of gradient magnetic fields corresponding to a slice selection gradient magnetic field, a read gradient magnetic field and a phase encode gradient magnetic field.

The RF coil unit 14 is disposed so as to surround the subject 40, for example. The RF coil unit 14 transmits each RF pulse corresponding to an electromagnetic wave to the subject 40, based on a control signal supplied from the controller 30 in the static magnetic field space 11 formed with the static magnetic field by the static magnetic field magnet unit 12 thereby to form a high frequency magnetic field. Consequently, the spins of proton in the imaging slice area of the subject 40 are excited. The RF coil unit 14 receives an electromagnetic wave generated when each of the spins of proton in the imaging slice area of the subject 40 is returned to its original magnetization vector, as a magnetic resonance signal.

The RF coil unit 14 is of a phased array coil 141 including a plurality of the independent surface coils shown in FIG. 2, for example. The surface coils are respectively individually connected to a transmitter and a receiver and configured so as to receive a plurality of magnetic resonance signals on a multichannel basis.

As shown in FIG. 2, for example, the phased array coil 141 includes independent surface coils C1, C2 and C3. As shown in FIGS. 3(a), 3(b), and 3(c), data (hereinafter also called "Fourier transform processed data") obtained by executing Fourier transform processing on echo signals respectively received by the surface coils C1, C2 and C3 are represented in different k spaces. Since the degree of non-uniformity of a rotating magnetic field varies depending upon locations, the peaks of the Fourier transform processed data are respectively shifted by different frequencies from the centers O in the k spaces. As shown in FIG. 3(a), for example, the peak of Fourier transform processed data D1 of the surface coil C1, which is represented in the corresponding k space, is shifted by a frequency $F_{D1}$ from the center in the k space. Similarly, as shown in FIGS. 3(b) and 3(c), the peaks of Fourier transform processed data D2 and D3 are respectively shifted by frequencies $F_{D2}$ and $F_{D3}$ from the centers O in the k spaces and respectively shifted by different frequencies from the centers O in the k spaces.

The cradle 15 has a table that places the subject 40 thereon. The cradle 15 moves the subject 40 placed on the table between the inside and outside of the static magnetic field space 11, based on a control signal supplied from the controller 30.

The operation console section 3 controls the scan section 2 in such a manner that the scan section 2 executes scans for the subject 40. The operation console section 3 generates an image of the subject 40, based on magnetic resonance signals obtained by the scans executed by the scan section 2, and displays the generated image.

The RF driver 22 has a gate modulator (not shown), an RF power amplifier (not shown) and an RF oscillator (not shown) to form a high frequency magnetic field within the static magnetic field space 11 by driving the RF coil unit 14. The RF driver 22 modulates an RF signal sent from the RF oscillator to a signal having predetermined timing and predetermined envelope using the gate modulator on the basis of the control signal outputted from the controller 30. The RF driver 22 allows the RF power amplifier to amplify the RF signal modulated by the gate modulator and outputs the same to the RF coil unit 14.

The gradient driver 23 drives the gradient coil unit 13 based on the control signal of the controller 30 to generate a gradient magnetic field within the static magnetic field space 11. The gradient driver 23 has three-system drive circuits (not shown) in association with the three-system gradient coils of the gradient coil unit 13.

The data acquisition unit 24 has a phase detector (not shown) and an analog/digital converter (not shown) to collect or acquire the magnetic resonance signals received by the RF coil unit 14. The data acquisition unit 24 phase-detects each magnetic resonance signal sent from the RF coil unit 14 by the phase detector with the output of the RF oscillator of the RF driver 22 as a reference signal, and outputs the phase-detected signal to the analog/digital converter. Then, the data acquisition unit 24 converts the magnetic resonance signal corresponding to the analog signal phase-detected by the phase detector into a digital signal by means of the analog/digital converter and outputs it to the image reconstruction unit 33.

The controller 30 has a computer and a program that allows each part to execute an operation corresponding to a predetermined scan using the computer. The controller 30 is connected to the operation unit 32. The controller 30 processes an operation signal inputted to the operation unit 32 and outputs a control signal to the cradle 15, RF driver 22, gradient driver 23 and data acquisition unit 24 to control them. In order to acquire a desired image, the controller 30 controls the image reconstruction unit 33 based on the operation signal sent from the operation unit 32.

The storage unit 31 is constituted of a computer. The storage unit 31 stores therein the magnetic resonance signals prior to image reconstruction processing, which are acquired by the data acquisition unit 24, and image data or the like subjected to the image reconstruction processing by the image reconstruction unit 33.

The operation unit 32 is made up of an operation device such as a keyboard, a mouse or the like. The operation unit 32 inputs operation data, an imaging protocol and the like from an operator and outputs the same to the controller 30.

The image reconstruction unit 33 is made up of a computer. The image reconstruction unit 33 is connected to the data acquisition unit 24 and executes image reconstruction processing on the magnetic resonance signal outputted from the data acquisition unit 24 to generate an image.

Figure 4:
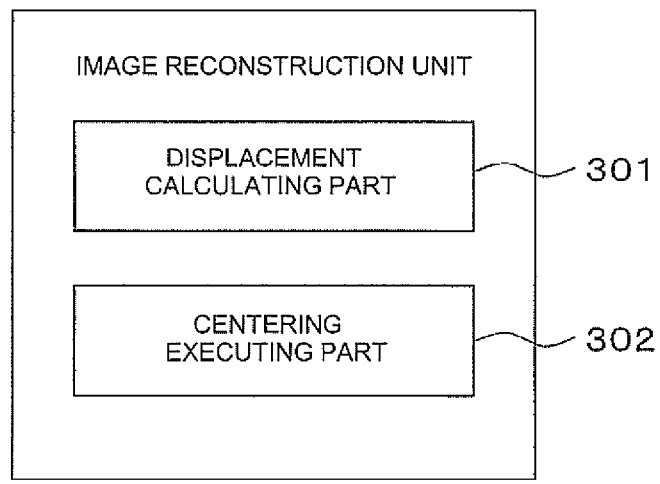
FIG. 4 is a block diagram illustrating a configuration of an image reconstruction unit 33 employed in one embodiment according to the invention.

FIG. 4 is a block diagram showing the construction of the image reconstruction unit 33 employed in one embodiment according to the invention.

As shown in FIG. 4, the image reconstruction unit 33 has a displacement calculating part 301 and a centering executing part 302. Although its details will be described later, the controller 30 calculates a displacement for displacing each echo signal received by the RF coil unit 14 to center the echo signal on a frequency axial center O in a k space, and executes centering processing thereon based on the calculated displacement.

Based on a plurality of echo signals received from the surface coils, the displacement calculating part 301 calculates displacements of the echo signals for centering the peaks of the echo signals on the frequency axial centers O in the k spaces.

The centering executing part 302 displaces all the received echo signals, based on the displacements calculated by the displacement calculating part 301 and thereby executes centering processing.

The display unit 34 is constituted of a display device such as a display and displays an image of the subject 40 produced by the image reconstruction unit 33.

Figure 5:
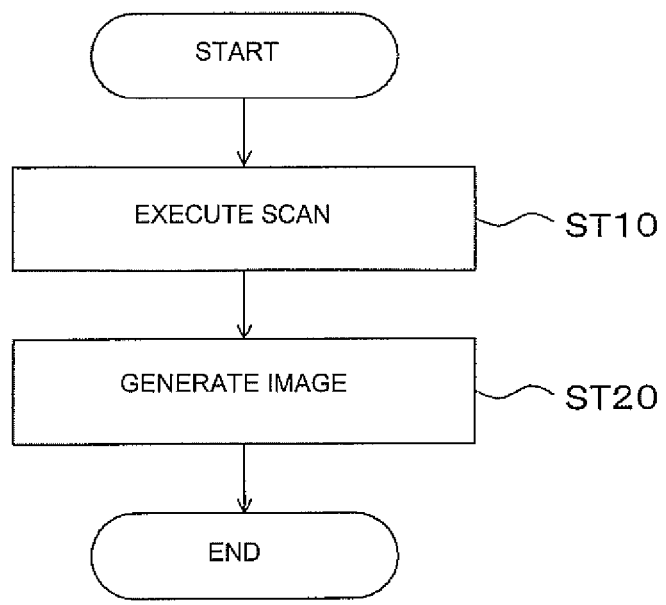
FIG. 5 is a flowchart showing the operation of imaging a subject 40 in a first embodiment according to the invention.

FIG. 5 is a flowchart showing the operation of imaging the subject 40 in the first embodiment according to the invention.

As shown in FIG. 5, a scan is first executed (ST10).

Here, the scan section 2 executes a scan for the subject 40.

Here, the controller 30 outputs a control signal to the RF driver 22, gradient driver 23 and data acquisition unit 24 respectively, based on the operation signal inputted to the operation unit 32 by the operator to control them, thereby scanning the subject 40 and allows the data acquisition unit 24 to acquire echo signals. The controller 30 allows the image reconstruction unit 33 to outputs the echo signals acquired by the data acquisition unit 24.

Next, the generation of an image is next carried out as shown in FIG. 5 (ST20).

Here, the image reconstruction processing is executed on each echo signal outputted from the data acquisition unit 24 to produce an image. Upon the image reconstruction processing, the centering processing on the received echo signals is executed in the k spaces.

Figure 6:
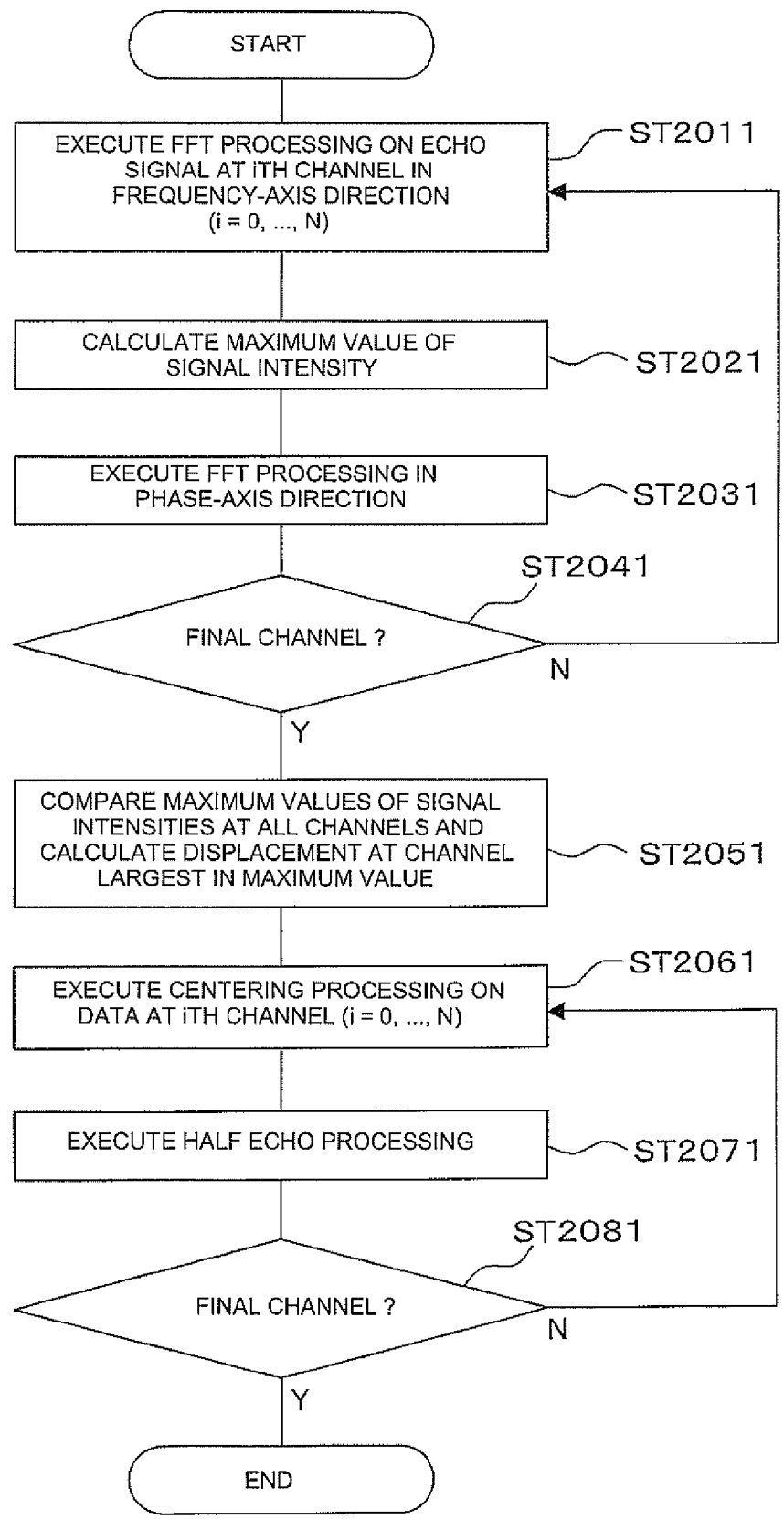
FIG. 6 is a flowchart illustrating the operation of executing centering processing on a plurality of received phase axial processing data in the first embodiment according to the invention.
Figure 7:
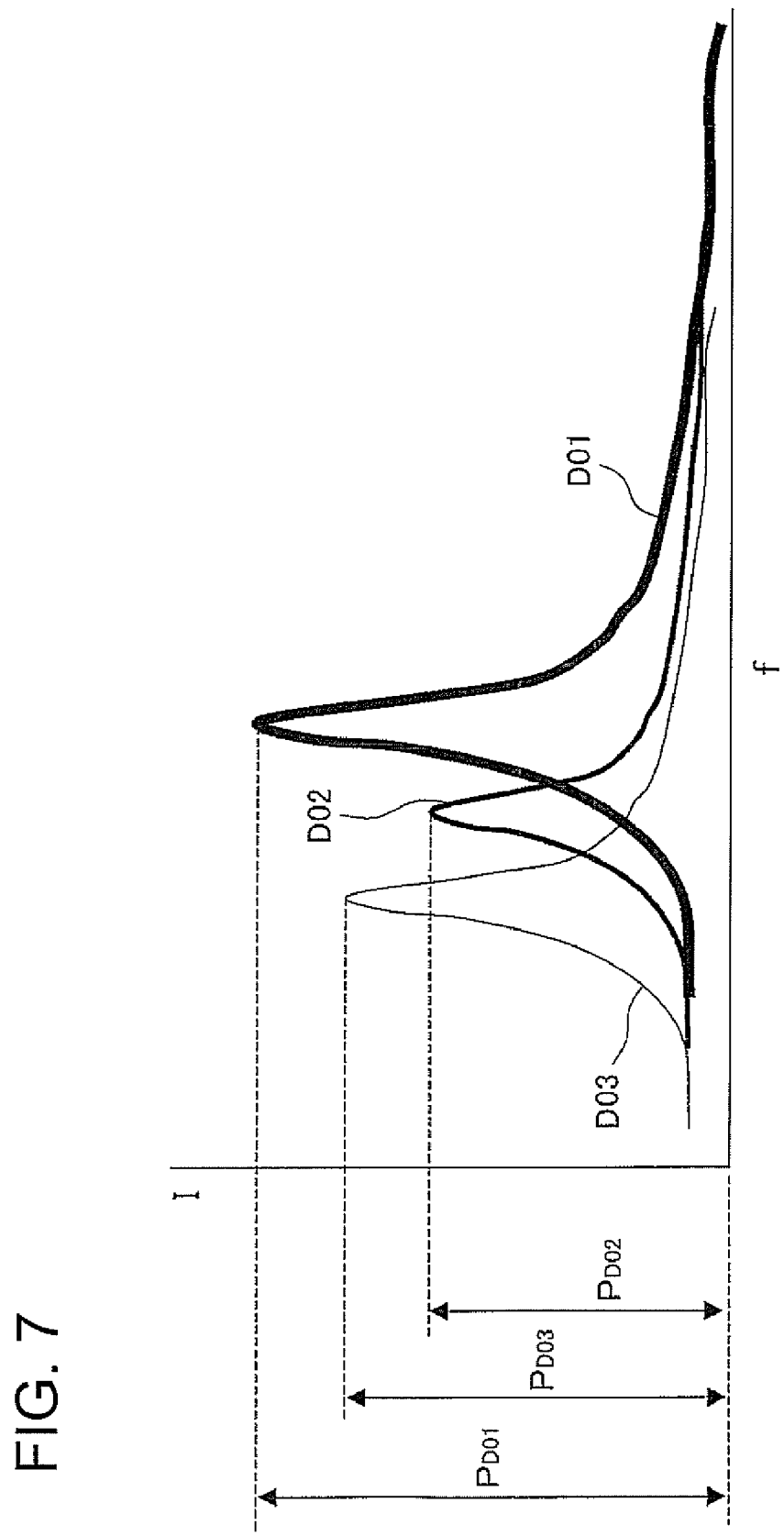
FIG. 7 is a diagram showing frequency axial processing data in the first embodiment according to the invention.
Figure 8:
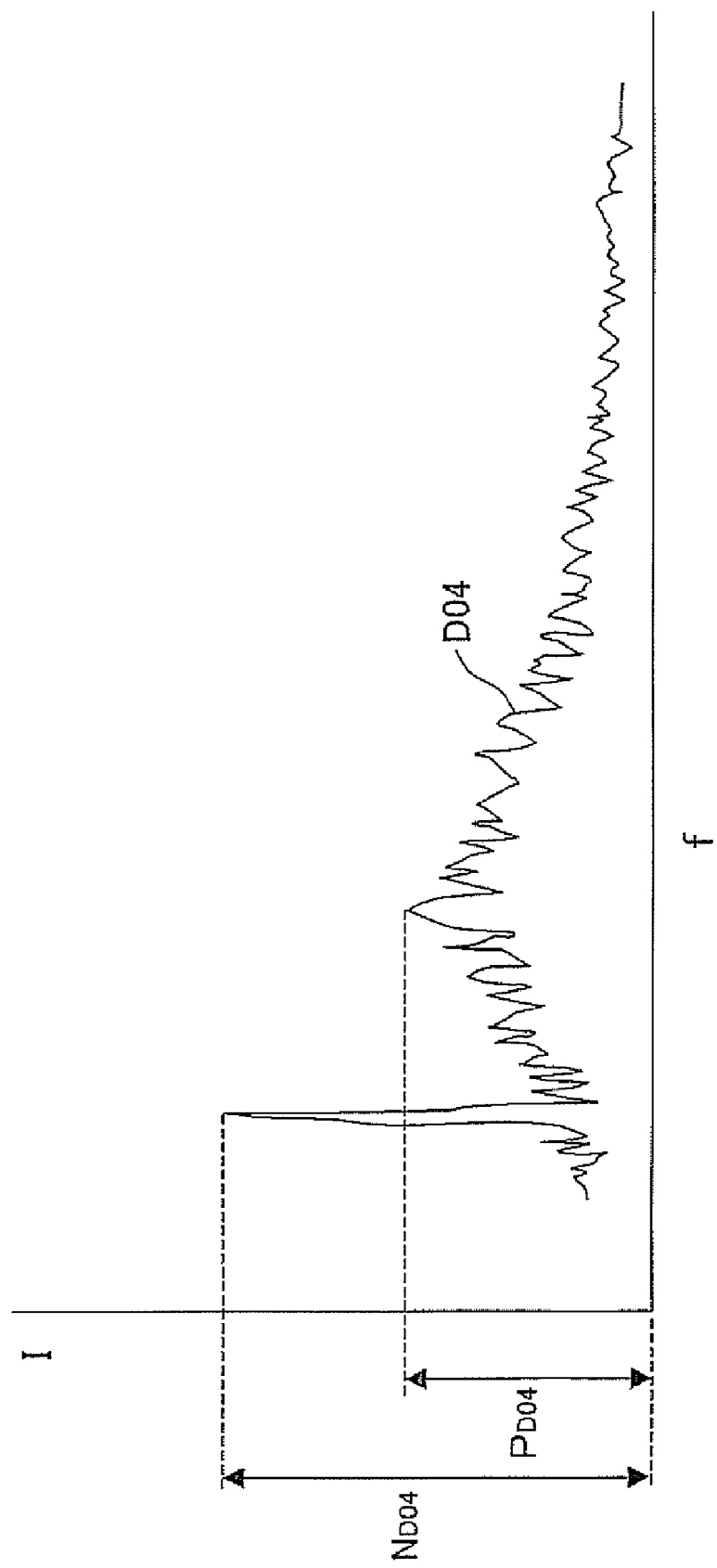
FIG. 8 is a diagram depicting frequency axial processing data affected by noise in the first embodiment according to the invention.
Figure 9:
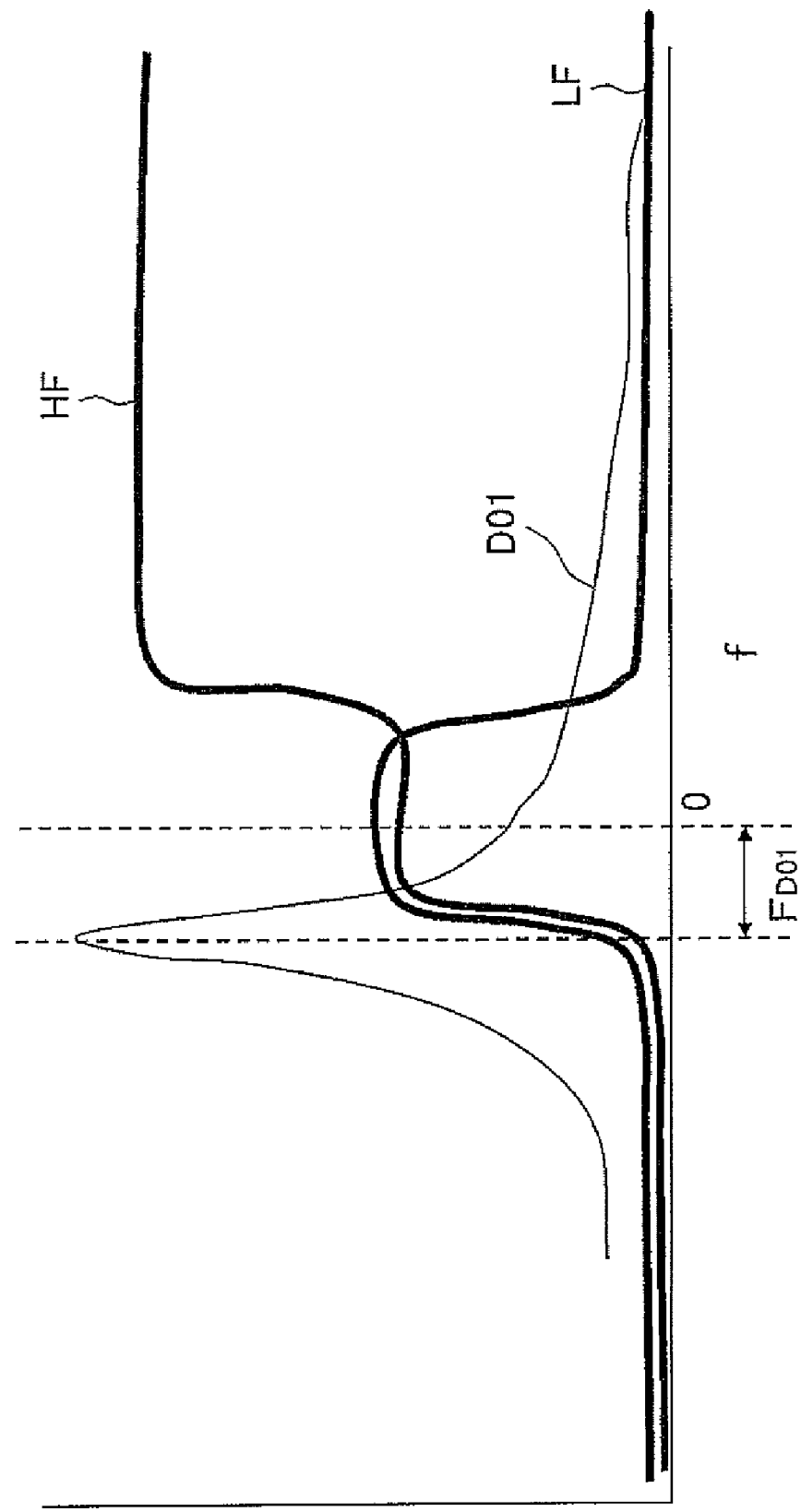
FIG. 9 is a diagram showing centering processing on phase axial processing data in the first embodiment according to the invention.
Figure 10:
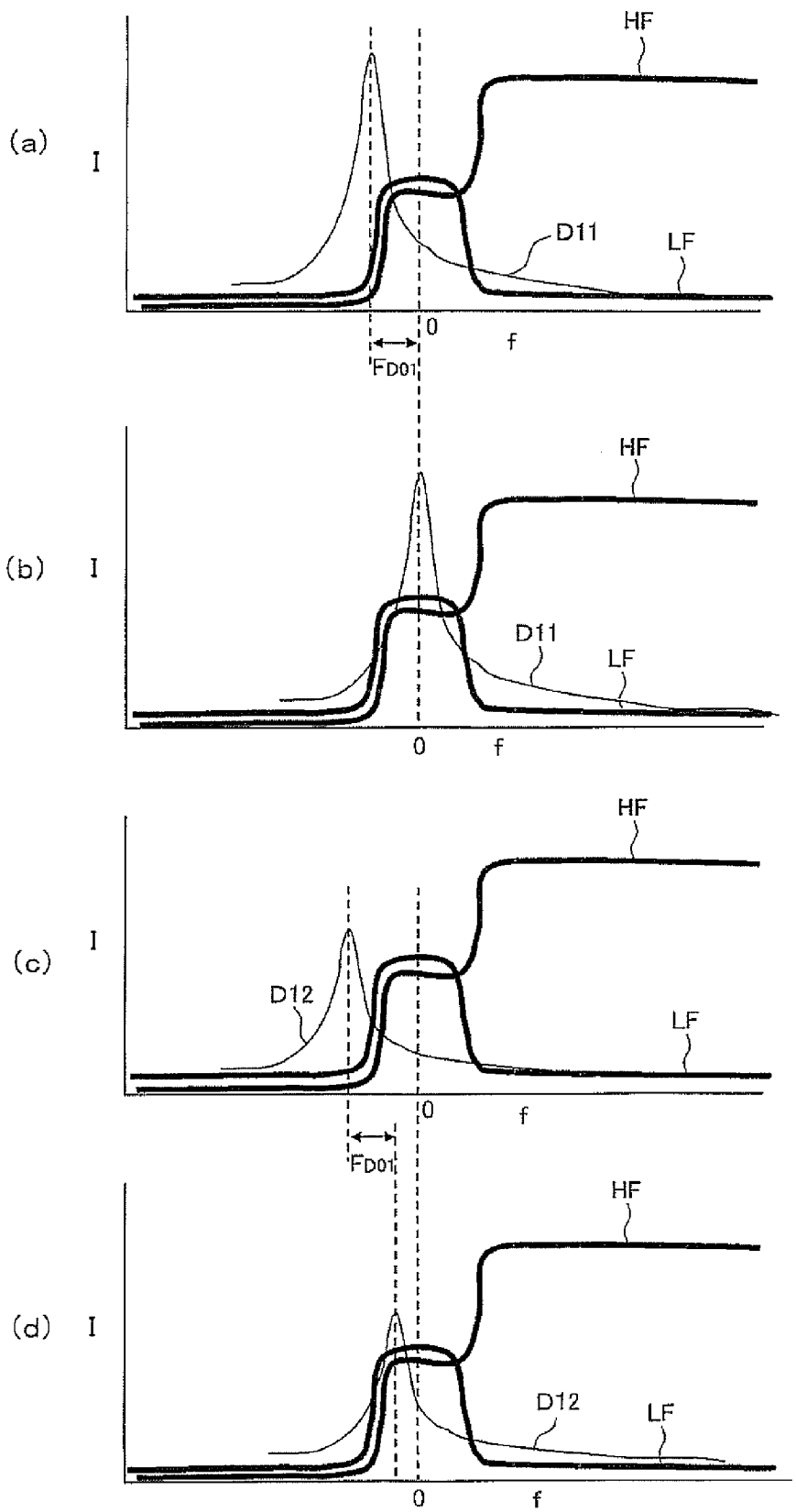
FIGS. 10(a)-10(d) are diagrams illustrating centering processing on phase axial processing data in the first embodiment according to the invention.

FIG. 6 is a flowchart illustrating the operation of executing centering processing on a plurality of received phase axial processing data in the first embodiment according to the invention. FIG. 7 is a diagram showing frequency axial processing data in the first embodiment according to the invention. The vertical axis indicates a signal intensity I, and the horizontal axis indicates a frequency f. Data obtained by executing fast Fourier transform (hereinafter also called "FFT") processing on echo signals received from the independent surface coils respectively are represented in different k spaces but represented in the same k space for convenience of the assistance of understanding. For the sake of convenience of the assistance of understanding, frequency axial processing data D01 is described in thick line, frequency axial processing data D02 is described in middle thick line, and frequency axial processing data D03 is described in thin line. FIG. 8 is a diagram depicting frequency axial processing data affected by noise in the first embodiment according to the invention. The vertical axis indicates a signal intensity I, and the horizontal axis indicates a frequency f. FIG. 9 and FIGS. 10($a$)-10($d$) are diagrams showing centering processing on phase axial processing data in the first embodiment according to the invention. The vertical axis indicates a signal intensity I, and the horizontal axis indicates a frequency f. A broken line indicative of each frequency O indicates a frequency axial center O in each k space. A displacement $F_{D01}$ is a displacement for displacing a point at which the signal intensity of frequency axial processing data D011 becomes maximum, to the frequency axial center O. Thick lines respectively indicate a homodyne high pass filter HF and a homodyne low pass filter LF. For the sake of convenience of understanding, the overlapping of the homodyne high pass filter HF and the homodyne low pass filter LF is described in shifted or slid form (drawings shown below are the same).

As shown in FIG. 6, FFT processing is first executed on each echo signal at an ith channel in the frequency direction (i=0, . . . , N) (ST2011).

Here, the FFT processing is executed on each echo signal received by a surface coil Ci at an ith channel as viewed in the frequency-axis direction.

Described specifically, the image reconstruction unit 33 executes FFT processing on each echo signal received by the surface coil Ci at the ith channel as viewed in the frequency-axis direction. The storage unit 31 stores therein data (hereinafter also called "frequency axial processing data") calculated by executing the FFT processing on each echo signal in the frequency-axis direction.

Next, the maximum value of signal intensities is next calculated (ST2021).

Here, the maximum value of the signal intensities of the frequency axial processing data calculated at Step ST2011 is calculated.

Described specifically, the maximum value of the signal intensities of the respective frequency axial processing data calculated by the image reconstruction unit 33 is calculated at Step ST2021. When data obtained by executing FFT processing on each echo signal received by the surface coil Ci at the ith channel as viewed in the frequency-axis direction is of the frequency axial processing data D01 as shown in FIG. 7, a peak value $P_{D01}$ is calculated as the maximum value of the signal intensity at the frequency axial processing data D01. When the data is of the frequency axial processing data D02, a peak value $P_{D02}$ is calculated as the maximum value of the signal intensity. When the data is of the frequency axial processing data D03, a peak value $P_{D03}$ is calculated as the maximum value of the signal intensity. In FIG. 7, the maximum values of the signal intensities at the respective frequency axial processing data are given as the peak values. However, in the case of the frequency axial processing data affected by noise or the like as shown in FIG. 8, for example, the maximum value of the signal strength does not necessarily reach the peak value. In this case, however, $N_{D04}$ is calculated as the maximum value of the signal intensity without calculating a peak value $P_{D04}$.

Next, FFT processing is executed in a phase-axis direction as shown in FIG. 6 (ST2031).

Here, the FFT processing is executed on the data calculated by executing the FFT processing in the frequency-axis direction at Step ST2011 as viewed in the phase-axis direction.

Described specifically, the FFT processing is executed in the phase-axis direction, on the frequency axial processing data calculated by the image reconstruction unit 33 and stored in the storage unit 31 at Step ST2011. The storage unit 31 stores therein data (hereinafter also called "phase axial processing data") calculated by executing the FFT processing in the phase-axis direction.

Next, as shown in FIG. 6, it is determined whether the phase axial processing data calculated at Step ST2031 corresponds to data calculated from an echo signal received from a surface coil at the final channel (ST2041).

Here, the controller 30 determines whether the phase axial processing data calculated at Step ST2031 corresponds to the data calculated from the echo signal received by the surface coil at the final channel. When the phase axial processing data is found not to correspond to the data calculated from the echo signal received by the surface coil at the final channel (No), the controller 30 controls the respective parts in such a manner that they continue the FFT processing in the frequency-axis direction, the calculation of the maximum value of the signal intensity, and the FFT processing in the phase-axis direction.

Next, as shown in FIG. 6, the maximum values of the signal intensities at all channels are compared and the displacement at the corresponding channel largest in maximum value is calculated (ST2051).

Here, the maximum values of the signal intensities at the frequency axial processing data calculated from the echo signals received from the surface coils at all the channels at Step ST2021 are compared. The displacement calculating part 301 calculates a difference between the frequency at which the signal intensity reaches maximum and the frequency at the frequency axial center O in each k space with the frequency axial processing data at the channel largest in the maximum value of the signal intensity as reference frequency axial processing data.

Described specifically, as shown in FIG. 7, the displacement calculating part 301 compares the peak values $P_{D01}$, $P_{D02}$ and $P_{D03}$ respectively corresponding to the maximum values of the signal intensities of the frequency axial processing data D01, D02 and D03 and determines the reference frequency axial processing data corresponding to the data largest in maximum value as the frequency axial processing data D01. Here, as in the case of the frequency axial processing data D04 shown in FIG. 8, the frequency axial processing data high in signal intensity at each noise portion as compared with the signal intensity at the peak is contained in a plurality of frequency axial processing data. When the signal intensity $N_{D04}$ at the noise portion is largest within the maximum values of the signal intensities at all the frequency axial processing data, the frequency axial processing data D04 is selected. However, the frequency axial processing data at which the signal intensity at the noise portion becomes higher than the signal intensity at the peak, is low in signal intensity as the entire frequency axial processing data. Therefore, such frequency axial processing data is not selected.

As shown in FIG. 9, the displacement calculating part 301 calculates the difference between the frequency at the point where the signal intensity of the frequency axial processing data D01 in the k space becomes maximum, and the frequency at the frequency axial center O in the k space, and sets the same as a displacement for displacing all phase axial processing data with the frequency difference as the displacement $F_{D01}$. Here, since the peak positions of the frequency axial processing data and the phase axial processing data remain unchanged, the displacement $F_{D01}$ can be used as the displacement for displacing the phase axial processing data.

Next, as shown in FIG. 6, centering processing on data at an ith channel is executed (i=0, . . . , N) (ST2061).

Here, the centering executing part 302 executes centering processing on phase axial processing data of a surface coil Ci at the ith channel, which is calculated by the image reconstruction unit 33 at Step ST2031, based on the displacement calculated by the displacement calculating part 301 at Step ST2051.

Described specifically, when the surface coil Ci at the ith channel is of the surface coil C1, for example, the centering executing part 302 executes centering processing for displacing phase axial processing data D11 shown in FIG. 10(a) by a displacement $F_{D01}$ as shown in FIG. 10(b) in a k space. Since the displacement $F_{D01}$ calculated at Step ST2051 is a displacement for displacing the phase axial processing data D11 to the frequency axial center O in the k space, the point (peak) at which the signal intensity of the phase axial processing data D11 reaches maximum is displaced to the frequency axial center O in the k space when the phase axial processing data D11 is displaced by the displacement $F_{D01}$. Since the peak of the phase axial processing data D11 displaced to the frequency axial center O in the k space passes through the homodyne high pass filter HF and homodyne low pass filter LF, the phase axial processing data D11 is suitably filtered.

As shown in FIG. 10(c), the peak of phase axial processing data D12 falls in the frequency different from the peak of the phase axial processing data D11 in the k space. Therefore, when the phase axial processing data D12 is displaced based on the displacement $F_{D01}$, the peak of the phase axial processing data D12 is not displaced to the frequency axial center O in the k space. Since, however, the peak of the displaced phase axial processing data D12 passes through the homodyne high pass filter HF and homodyne low pass filter LF lying in the frequency axial center O in the k space as shown in FIG. 10(d), the phase axial processing data D12 is suitably filtered. Accordingly, artifacts are almost nonexistent.

The centering executing part 302 executes centering processing even on phase axial processing data D13, based on the displacement $F_{D01}$ in like manner. Even as to the phase axial processing data D13 in a manner similar to the phase axial processing data D12, its peak passes through the homodyne high pass filter HF and homodyne low pass filter LF and hence the phase axial processing data D13 is suitably filtered. Accordingly, artifacts are almost nonexistent.

Next, half echo processing is executed as shown in FIG. 6 (ST2071).

Here, the image reconstruction unit 33 executes the half echo processing on the phase axial processing data subjected to the centering processing at ST2061.

Next, as shown in FIG. 6, it is determined whether data subjected to the half echo processing is data at the final channel (ST2081).

Here, the controller 30 determines whether data (hereinafter also referred to "half echo processing") calculated by executing the half echo processing at ST2071 is calculated from an echo signal received by the surface coil at the final channel. When the half echo processing data is found not to correspond to the data calculated from the echo signal received by the surface coil at the final channel (No), the controller 30 controls the respective parts in such a manner that they continue the centering processing and the half echo processing.

In the first embodiment of the invention as described above, the maximum values of signal intensities of respective frequency axial processing data calculated by executing, in a frequency-axis direction, FFT processing on all echo signals received by a plurality of surface coils are calculated. Reference frequency axial processing data largest in the maximum value out of the maximum values of the signal intensities of all the frequency axial processing data is determined. A difference between the frequency of a point at which the signal intensity of the determined reference frequency axial processing data becomes maximum, and the frequency at a frequency axial center O in a k space is calculated. The frequency difference is set as a displacement for displacing all the frequency axial processing data. Phase axial processing data is displaced based on the calculated displacement to execute centering processing. Half echo processing is executed on the data subjected to the centering processing to generate an image.

Thus, frequency axial processing data at which the maximum value is not brought to the peak, i.e., frequency axial processing data at which a noise portion becomes higher than an actual peak in signal intensity, is low in signal intensity as the entire frequency axial processing data. Therefore, the frequency axial processing data is not selected as reference frequency axial processing data largest in the maximum value of the signal intensity. Accordingly, the first embodiment according to the invention displaces all the phase axial processing data in the k space, based on the displacement for displacing the point at which the signal intensity of the frequency axial processing data largest in the maximum value of the signal intensity becomes maximum, to the frequency axial center O in the k space, thereby making it possible to prevent artifacts of each generated image and enhance image quality.

A second embodiment according to the invention will be explained below with reference to FIG. 11.

The second embodiment is identical to the first embodiment in terms of portions other than the calculation of the integral values, corresponding to Step ST2022 and the calculation of the displacement, corresponding to Step ST2052 in an operation flow. Descriptions of dual parts will therefore be omitted.

A description will be made below of the operation of photographing or imaging a subject 40 using a magnetic resonance imaging apparatus 1 of the present embodiment.

Figure 11:
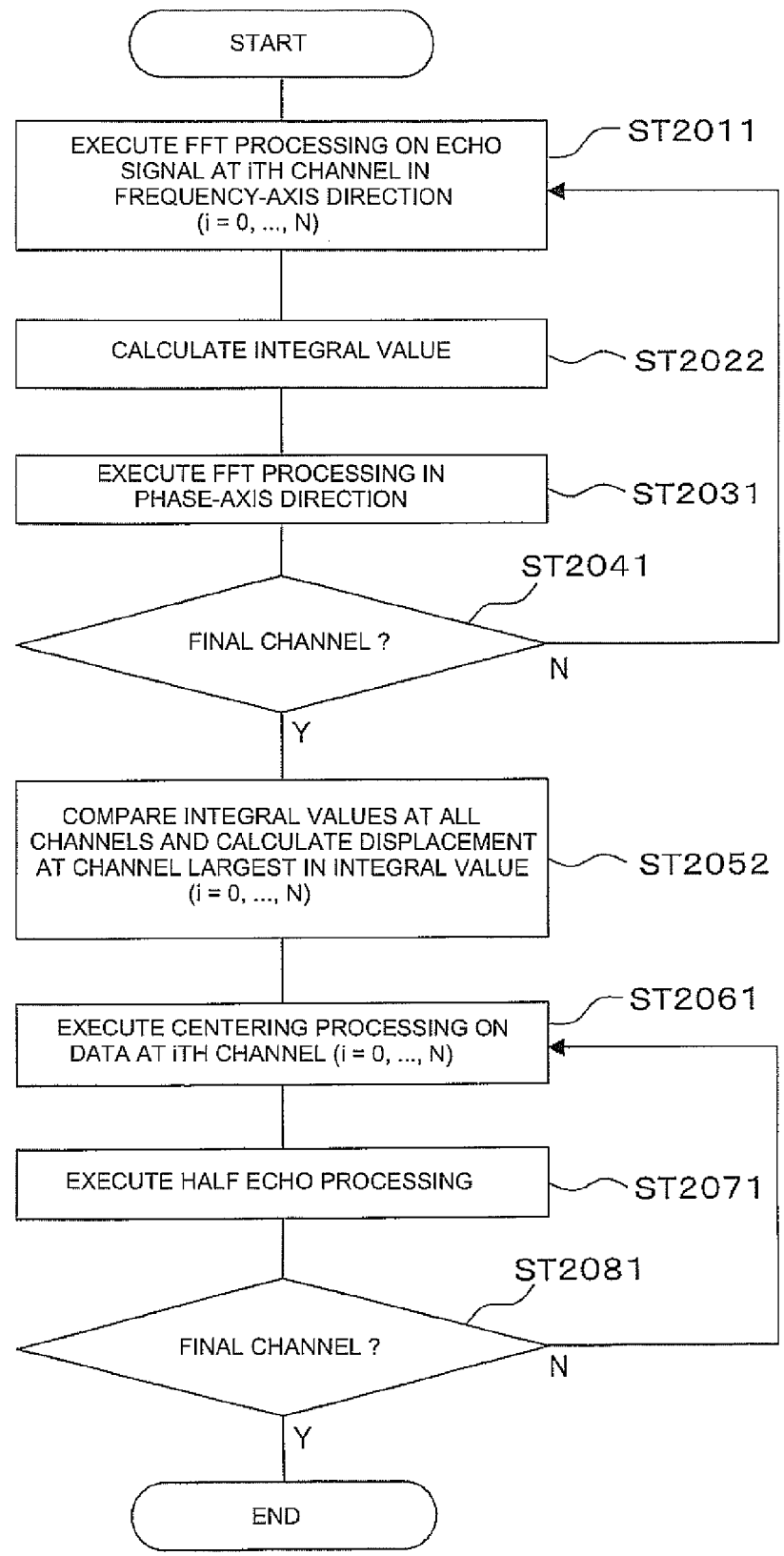
FIG. 11 is a flowchart showing the operation of imaging a subject 40 in a second embodiment according to the invention.

FIG. 11 is a flowchart showing the operation of imaging the subject 40 in the second embodiment according to the invention. FIGS. 12(a), 12(b), and 12(c) are diagrams depicting integral values of profiles of frequency axial processing data in the second embodiment according to the invention. The vertical axis indicates a signal intensity I, and the horizontal axis indicates a frequency f. Diagonally-shaded portions surrounded by the profiles of the frequency axial processing data and the horizontal axes correspond to integral values. $S_{D01}$, $S_{D02}$ and $S_{D03}$ indicate integral values of frequency axial processing data D01, D02 and D03 respectively.

As shown in FIG. 11, integral values are first calculated (ST2022).

Here, at Step ST2011, a displacement calculating part 301 calculates integral values in k spaces, of data calculated by executing frequency axial FFT processing.

Described specifically, at Step ST2011, the displacement calculating part 301 calculates integral values of profiles of frequency axial processing data calculated by an image reconstruction unit 33. When data calculated by executing FFT processing on each echo signal received by a surface coil Ci at an ith channel as viewed in a frequency-axis direction is of a frequency axial processing data D01 as shown in FIG. 12(a), an integral value $S_{D01}$ of the profile of the frequency axial processing data D01 is calculated. The integral value $S_{D01}$ indicates the area of a diagonally-shaped portion surrounded by the data profile of the frequency axial processing data D01 and the horizontal axis. When the calculated data corresponds to frequency axis processing data D02 and D03, integral values SD02 and SD03 are respectively calculated as integral values.

Next, as shown in FIG. 11, the integral values at all channels are compared and a displacement at the corresponding channel largest in integral value is calculated (ST2052).

Here, the integral values of the profiles of all frequency axial processing data calculated at ST2022 are compared. The displacement calculating part 301 calculates a difference between the frequency of a point at which the signal intensity becomes maximum, and the frequency at a frequency axial center O in a k space assuming that frequency axial processing data at the channel largest in integral value in the k space is taken as reference frequency axial processing data.

Figure 12:
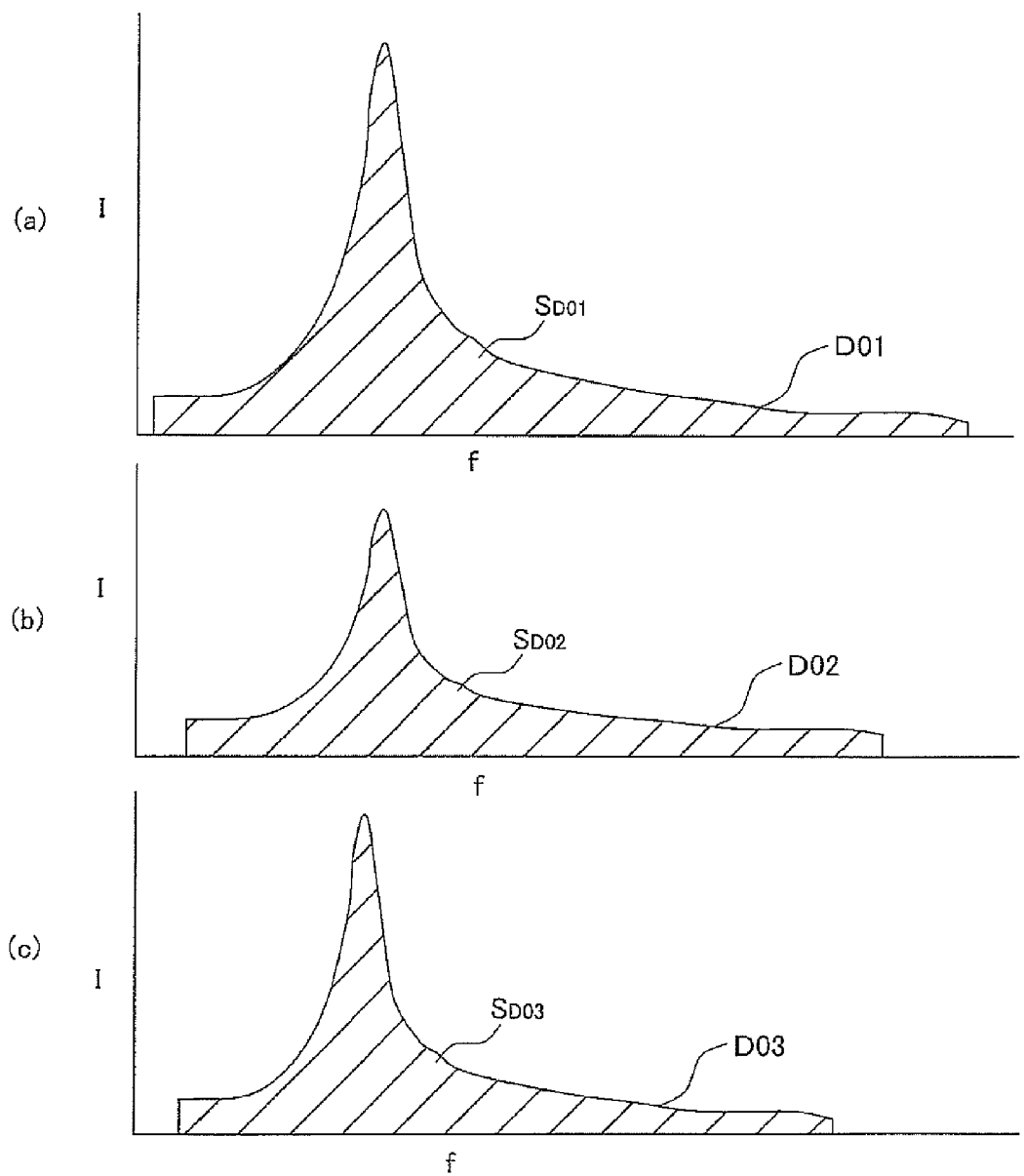
FIGS. 12(a), 12(b), and 12(c) are diagrams depicting integral values of profiles of frequency axial processing data in the second embodiment according to the invention.

Described specifically, as shown in FIG. 12, the integral values $S_{D01}$, $S_{D02}$ and $S_{D03}$ of the profiles of the frequency axial processing data D01, D02 and D03 are compared. The reference frequency axial processing data corresponding to data largest in integral value is determined as the frequency axial processing data D01. As shown in FIG. 9, the displacement calculating part 301 calculates a difference between the frequency at a point where the signal intensity of the frequency axial processing data D01 becomes maximum in the k space, and the frequency at the frequency axial center O in the k space, and sets the same as a displacement for displacing all phase axial processing data with the frequency difference as a displacement $F_{D01}$. Here, since the peak positions of the frequency axial processing data and the phase axial processing data remain unchanged, the displacement $F_{D01}$ can be used as the displacement for displacing the phase axial processing data.

In the second embodiment of the invention as described above, the integral values of profiles of respective frequency axial processing data calculated by executing, in a frequency-axis direction, FFT processing on all echo signals received by a plurality of surface coils are calculated. Reference frequency axial processing data largest in the integral value is determined from the integral values of the profiles of all the frequency axial processing data. A difference between the frequency of a point at which the signal intensity of the determined frequency axial processing data becomes maximum, and the frequency at a frequency axial center O in a k space is calculated. The frequency difference is set as a displacement for displacing all the frequency axial processing data. Phase axial processing data is displaced based on the calculated displacement to execute centering processing. Half echo processing is executed on the data subjected to the centering processing to generate an image.

Thus, when the maximum value of frequency axial processing data is not brought to the peak, i.e., since the frequency axial processing data at which a noise portion becomes higher than an actual peak in signal intensity, is small in terms of the integral value of the profile of the frequency axial processing data. Therefore, the frequency axial processing data is not selected as reference frequency axial processing data in the present embodiment. Accordingly, the second embodiment according to the invention displaces all the phase axial processing data in the k space, based on the displacement for displacing the point at which the signal intensity of the frequency axial processing data largest in the integral value of the profile of the frequency axial processing data becomes maximum, to the frequency axial center O in the k space, thereby making it possible to prevent artifacts of each generated image and enhance image quality.

A third embodiment according to the invention will be explained below with reference to FIG. 13.

The third embodiment is identical to the first embodiment in terms of portions other than the calculation of the displacement, corresponding to Step ST2053 and the execution of the centering processing, corresponding to Step ST2063 in an operation flow. Descriptions of dual parts will therefore be omitted.

A description will be made below of the operation of photographing or imaging the subject 40 using the magnetic resonance imaging apparatus 1 of the present embodiment.

Figure 13:
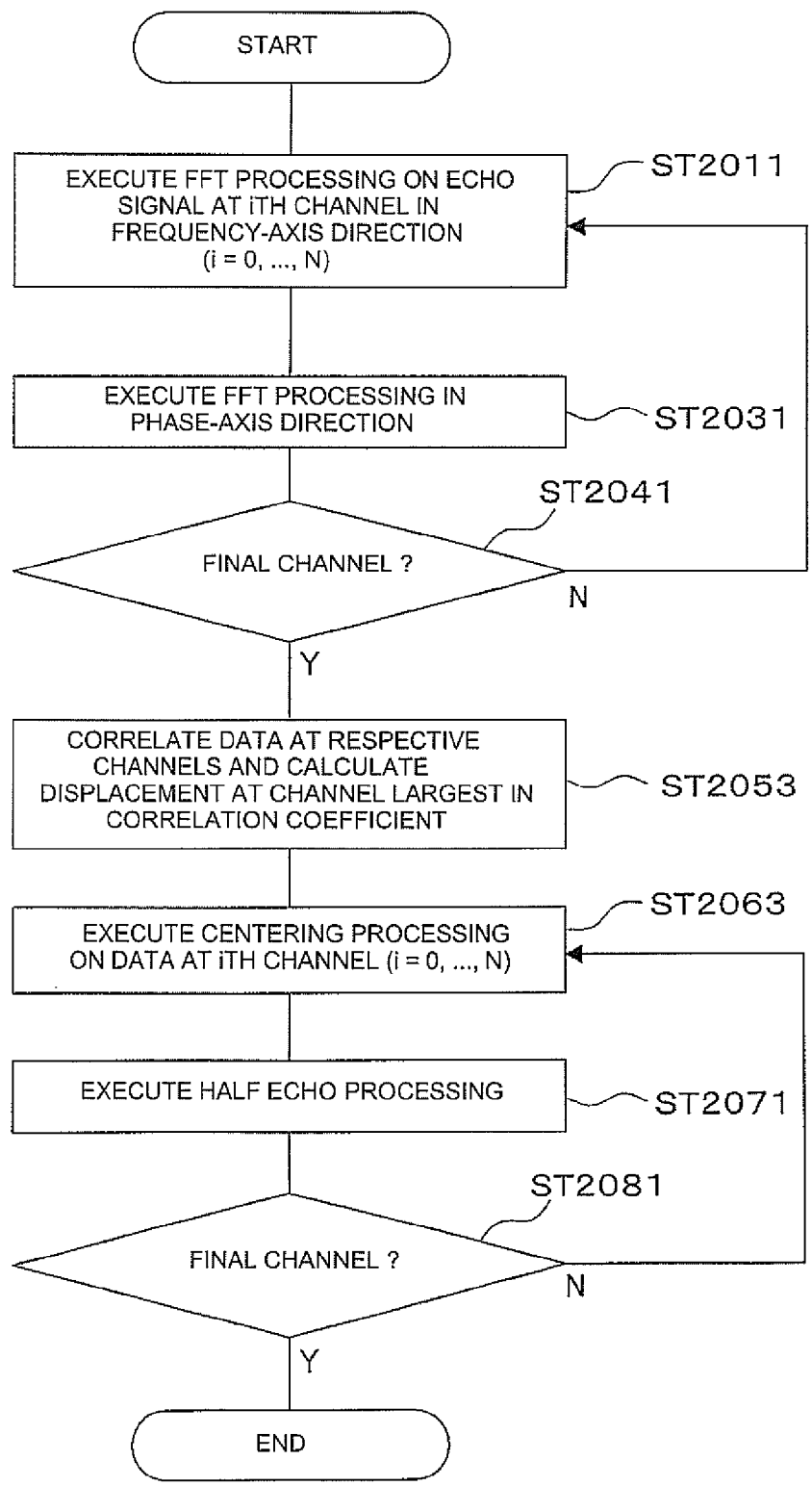
FIG. 13 is a flowchart showing the operation of imaging a subject 40 in a third embodiment according to the invention.
Figure 14:
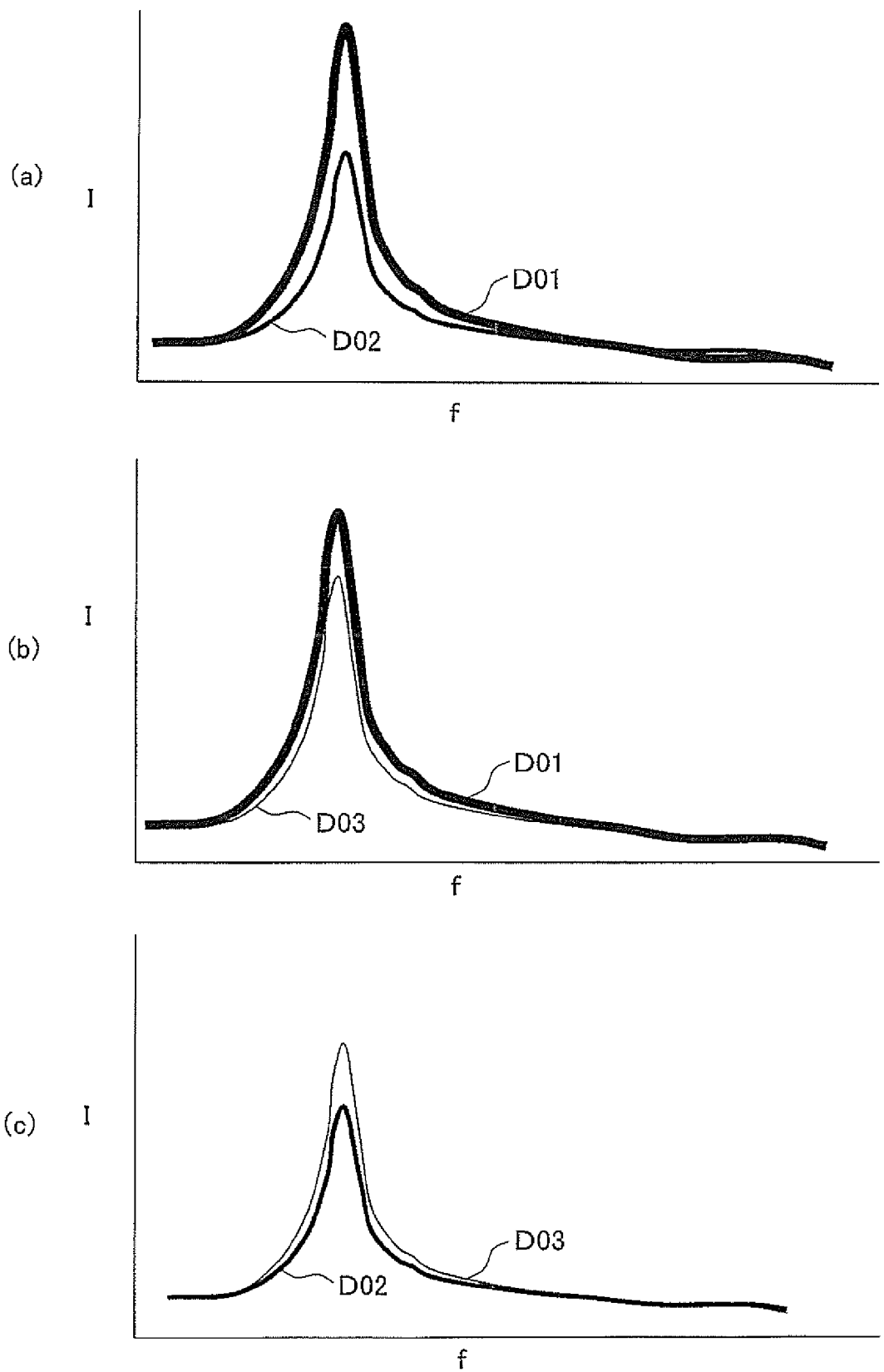
FIGS. 14(a), 14(b), and 14(c) are correlation diagrams showing the correlation between frequency axial processing data in the third embodiment according to the invention.
Figure 15:
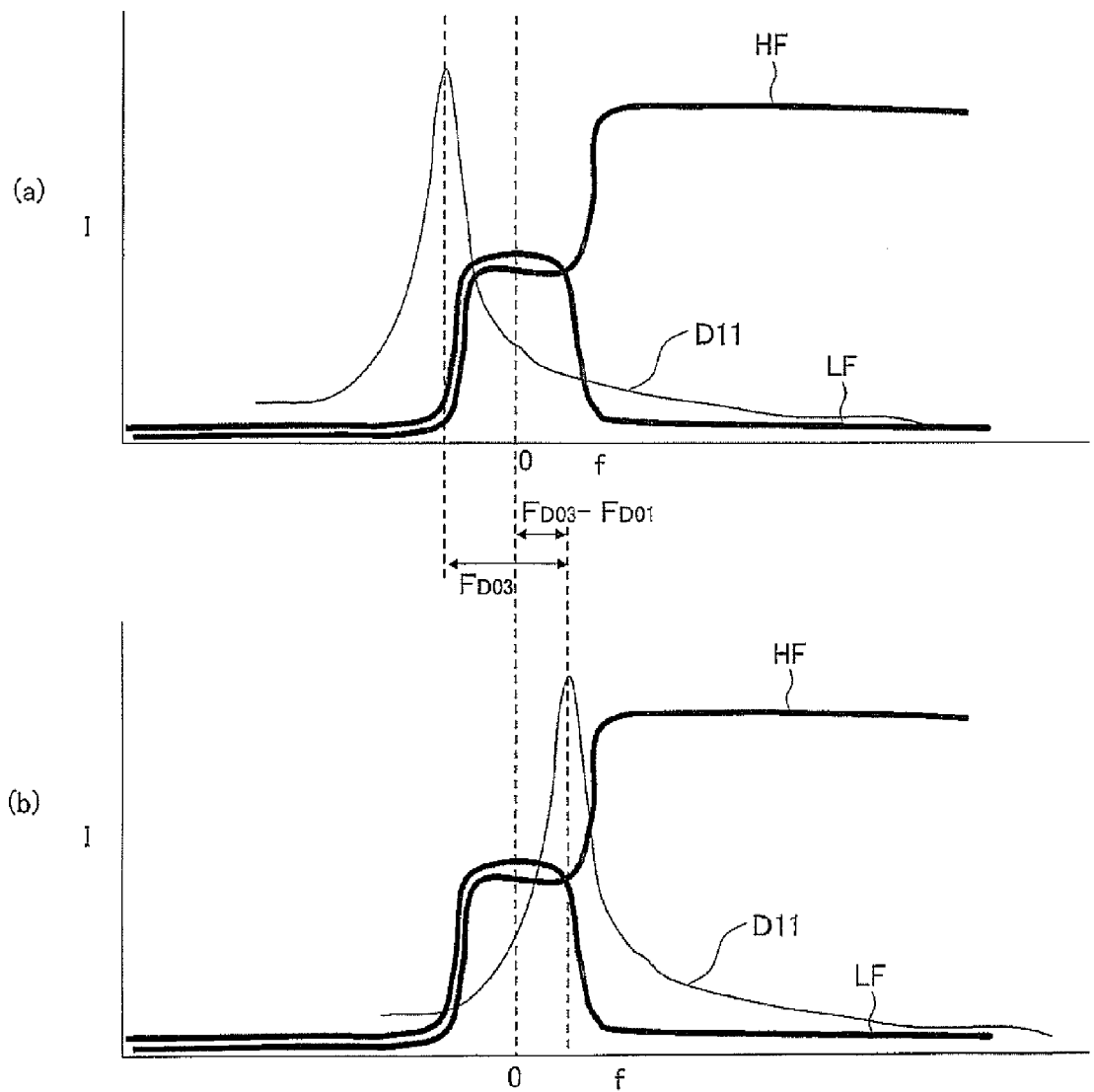
FIGS. 15(a) and 15(b) are diagrams illustrating centering processing on phase axial processing data, based on each frequency difference in frequency axial processing data at each which a correlation coefficient thereof is maximum, in the third embodiment according to the invention.

FIG. 13 is a flowchart showing the operation of imaging the subject 40 in the third embodiment according to the invention. FIGS. 14(*a*), 14(*b*), and 14(*c*) are correlation diagrams showing the correlation between frequency axial processing data in the third embodiment according to the invention. The vertical axis indicates a signal intensity, and the horizontal axis indicates a frequency. For the sake of convenience of the assistance of understanding, frequency axial processing data D01 is described in thick line, frequency axial processing data D02 is described in middle thick line, and frequency axial processing data D03 is described in thin line, respectively. FIG. 15 are diagrams illustrating centering processing on phase axial processing data, based on each frequency difference in frequency axial processing data at each which a correlation coefficient thereof is maximum, in the third embodiment according to the invention. The vertical axis indicates a signal intensity I, and the horizontal axis indicates a frequency f.

Firstly, as shown in FIG. 13, data at respective channels are correlated and the displacement of the corresponding channel largest in correlation coefficient is calculated (ST2053).

Here, the displacement calculating part 301 makes correlations with frequency axial processing data at other channels every frequency axial processing data at the respective channels to calculate correlation coefficients. The displacement calculating part 301 calculates a difference between the frequency of a point where the signal intensity becomes maximum, and the frequency at a frequency axial center O in a k space with the frequency axial processing data at the channel largest in correlation coefficient in the k space as reference frequency axial processing data.

Described specifically, as shown in FIG. 14(*a*) by way of example, frequency axial processing data D01 and frequency axial processing data D02 are correlated. The displacement calculating part 301 calculates a correlation coefficient $R_{12}$ between the frequency axial processing data D01 and the frequency axial processing data D02. As shown in FIGS. 14(*b*) and 14(*c*), a correlation coefficient $R_{13}$ between the frequency axial processing data D01 and frequency axial processing data D03, and a correlation coefficient $R_{23}$ between the frequency axial processing data D02 and the frequency axial processing data D03 are also calculated by the displacement calculating part 301. The correlation coefficient is calculated in accordance with the following equation (1):

$$R_{xy} = \frac{\sum_{i=1}^{n}(x_i - \bar{x})(y_i - \bar{y})}{\sqrt{\sum_{i=1}^{n}(x_i - \bar{x})^2}\sqrt{\sum_{i=1}^{n}(y_i - \bar{y})^2}} \tag{1}$$

where $\bar{x}$: arithmetic average of $x=\{x_i\}$, and $\bar{y}$: arithmetic average of $y=\{y_i\}$ Next, the displacement calculating part 301 calculates the average value of correlation coefficient at the respective frequency axial processing data. For example, the average value of the correlation coefficient at the frequency axial processing data D01 is expressed in as $(R_{12}+R_{13})/2$. Similarly, the average value of the correlation coefficient at the frequency axial processing data D02 is expressed in $(R_{12}+R_{23})/2$, and the average value of the correlation coefficient at the frequency axial processing data D03 is expressed in $(R_{13}+R_{23})/2$. The displacement calculating part 301 compares the respective average values and determines reference frequency axial processing data corresponding to data largest in average value. The displacement calculating part 301 calculates a difference between the frequency of a point largest in signal intensity at the frequency axial processing data largest in average value, and the frequency at the frequency axial center O in the k space. The frequency difference is set as a displacement for displacing all phase axial processing data. In the present embodiment, the reference frequency axial processing data corresponding to the data largest in correlation coefficient is of the frequency axial processing data D03. Thus, the set displacement becomes a displacement FD03. Since the peak positions of the frequency axial processing data and the phase axial processing data remain unchanged here, the displacement $F_{D03}$ can be used as the displacement for displacing the phase axial processing data.

Next, as shown in FIG. 13, centering processing on data at an ith channel is executed (i=0, ..., N) (ST2063).

Here, the centering executing part 302 executes centering processing on phase axial processing data of a surface coil Ci at the ith channel, based on the displacement calculated by the displacement calculating part 301 at Step ST2053.

Described specifically, when the surface coil Ci at the ith channel is of the surface coil C1 as shown in FIG. 15(a), for example, the centering executing part 302 displaces phase axial processing data D11 shown in FIG. 15(a) by a displacement $F_{D03}$ in a k space as shown in FIG. 15(b) and executes centering processing on the phase axial processing data D11. In this case, the peak of the phase axial processing data D11 is shifted from the frequency axial center O in the k space by ($F_{D03}-F_{D01}$). Since, however, it passes through the homodyne high pass filter HF and homodyne low pass filter LF, the phase axial processing data D11 is suitably filtered.

In a manner similar to the above, the centering executing part 302 displaces even phase axial processing data D12 and D13, based on the displacement $F_{D03}$ in the k space and executes centering processing thereon. Since the peaks thereof pass through the homodyne high pass filter HF and the homodyne low pass filter LF each placed in the frequency axial center O in the k space even in this case, the phase axial processing data D12 and D13 are suitably filtered.

In the third embodiment of the invention as described above, respective frequency axial processing data calculated by executing, in a frequency-axis direction, FFT processing on echo signals received by a plurality of surface coils, and other frequency axial processing data are correlated to calculate correlation coefficients. Then, the difference between the frequency of a point brought to the maximum in signal intensity at frequency axial processing data for a channel largest in correlation coefficient, and the frequency at a frequency axial center O in a k space is calculated. The calculated frequency difference is set as a displacement for displacing all the frequency axial processing data. Each phase axial processing data is displaced based on the calculated displacement and thereby centering processing is executed. Half echo processing is executed on the data subjected to the centering processing thereby to generate an image.

Thus, when the maximum value of frequency axial processing data is not brought to the peak, i.e., since the frequency axial processing data at which a noise portion becomes higher than an actual peak in signal intensity, is low in correlation with other frequency axial processing data, the frequency axial processing data is not selected as reference frequency axial processing data in the present embodiment. Accordingly, the third embodiment according to the invention displaces all the phase axial processing data in the k space, based on the displacement for displacing the point at which the signal intensity of the frequency axial processing data largest in the correlation coefficient becomes maximum, to the frequency axial center O in the k space, thereby making it possible to prevent artifacts of each generated image. It is thus possible to enhance image quality.

A fourth embodiment according to the invention will be explained below with reference to FIG. 16.

The fourth embodiment is identical to the first embodiment in terms of portions other than the calculation of the average value of displacement, corresponding to Step ST2054 and the execution of centering processing, corresponding to Step ST2064 in an operation flow. Descriptions of dual parts will therefore be omitted.

A description will be made below of the operation of photographing or imaging the subject 40 using the magnetic resonance imaging apparatus 1 of the present embodiment.

Figure 16:
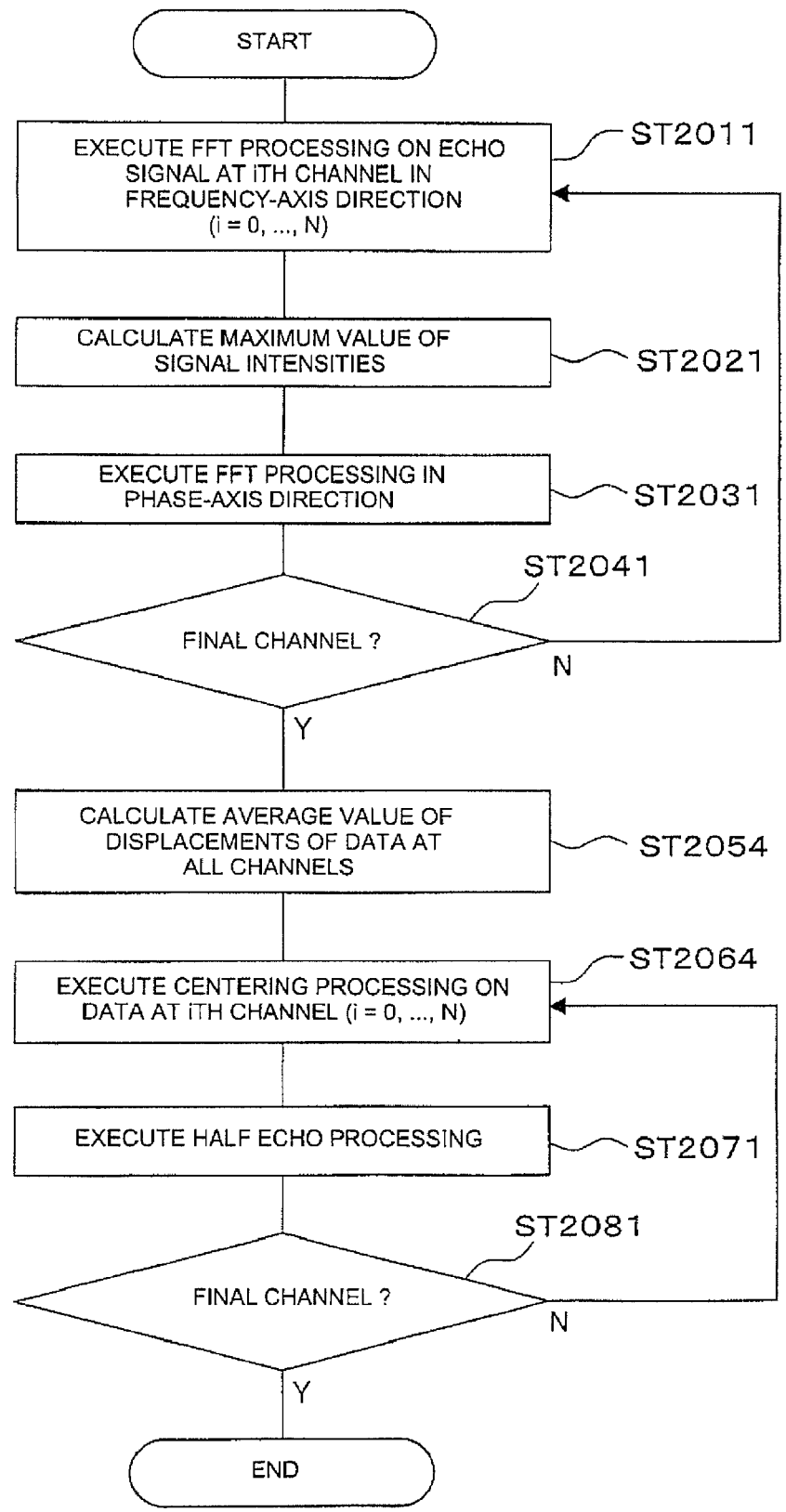
FIG. 16 is a flowchart showing the operation of imaging a subject 40 in a fourth embodiment according to the invention.
Figure 17:
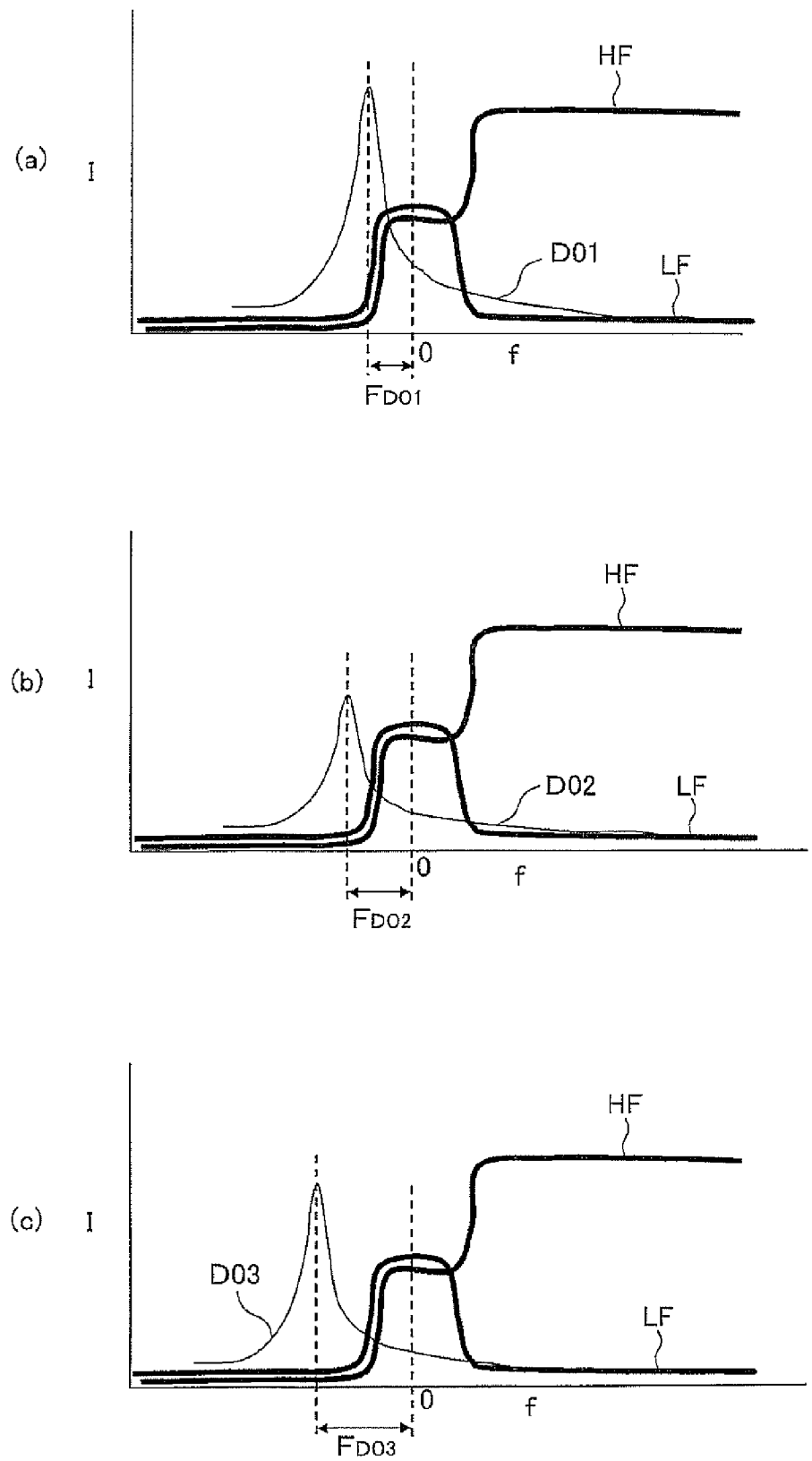
FIGS. 17(a), 17(b), and 17(c) are diagrams showing the maximum value of signal intensities of frequency axial processing data and frequency differences in the fourth embodiment according to the invention.
Figure 18:
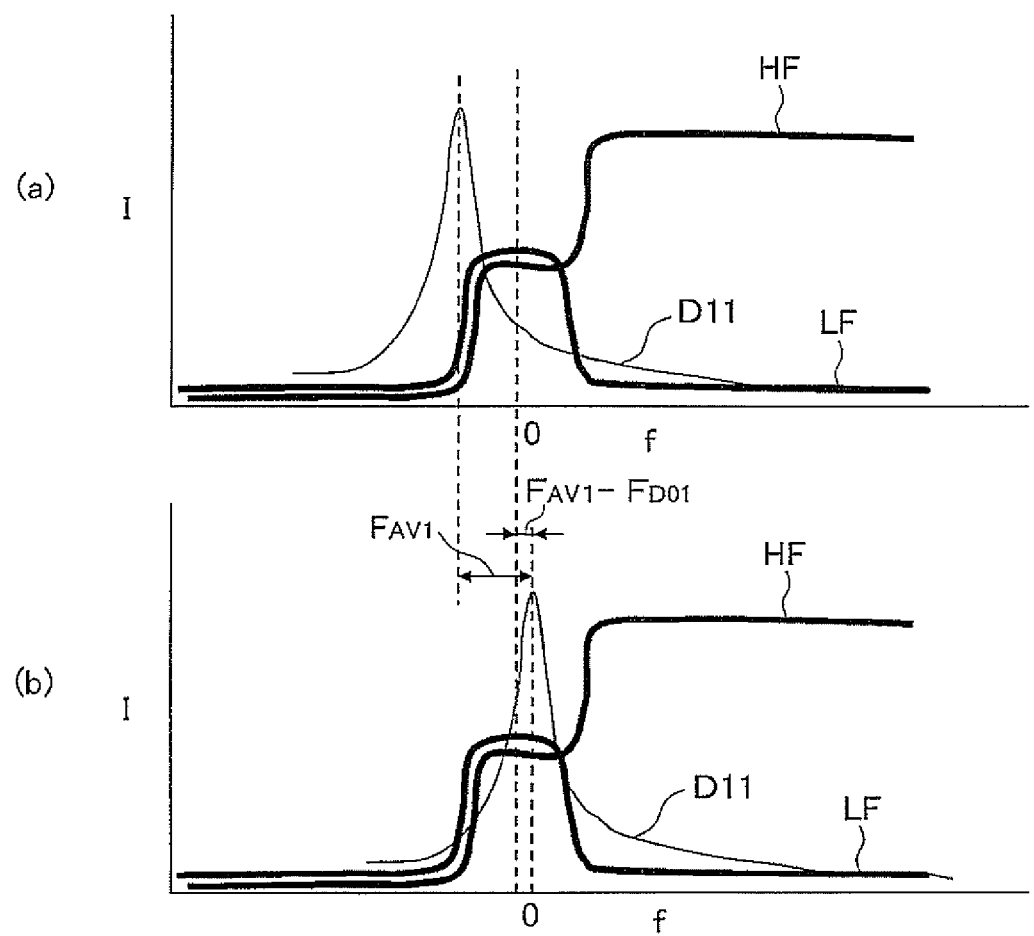
FIGS. 18(a) and 18(b) are diagrams illustrating centering processing on phase axial processing data, based on a displacement corresponding to the average value of all frequency differences in the fourth embodiment according to the invention.

FIG. 16 is a flowchart showing the operation of imaging the subject 40 in the fourth embodiment according to the invention. FIGS. 17(a), 17(b), and 17(c) are diagrams showing the maximum value of signal intensities of frequency axial processing data and frequency differences in frequency axial centers O in k spaces in the fourth embodiment according to the invention. The vertical axis indicates a signal intensity I, and the horizontal axis indicates a frequency f FIGS. 18(a) and 18(b) are diagrams illustrating centering processing on phase axial processing data, based on a displacement corresponding to the average value of all frequency differences in the fourth embodiment according to the invention. The vertical axis indicates a signal intensity I, and the horizontal axis indicates a frequency f. A displacement $F_{AV1}$ indicates the average value of displacements of all frequency axial processing data.

As shown in FIG. 16, the average value of frequency differences between data at all channels is first calculated (ST2054).

Here, the difference between the frequency of a point at which the signal intensity of each of the frequency axial processing data calculated at ST2021 indicates the maximum value, and the frequency at the frequency axial center O in the k space is calculated, and the average value of the frequency differences at all frequency axial processing data is calculated.

Described specifically, as shown in FIG. 17(a) by way of example, the displacement calculating part 301 calculates a frequency difference $F_{D01}$ between the frequency at a point where the signal intensity of frequency axial processing data D01 becomes maximum, and the frequency at the frequency axial center O in the k space. Similarly, as shown in FIGS. 17(b) and 17(c), the displacement calculating part 301 calculates frequency differences $F_{D02}$ and $F_{D03}$ between the frequencies at points where the signal intensities of frequency axial processing data D02 and D03 become maximum, and the frequency at the frequency axial center O in the k space, respectively. The displacement calculating part 301 calculates ($F_{D01}+F_{D02}+F_{D03}$)/3 corresponding to the average value of the frequency differences between the respective frequency axial processing data. The average value is set as a displacement $F_{AV1}$ for phase axial processing data at all channels. Since the peak positions of the frequency axial processing data and the phase axial processing data remain unchanged here, the displacement $F_{AV1}$ can be used as the displacement for displacing the phase axial processing data.

Next, as shown in FIG. 16, centering processing on data at an ith channel is executed (i=0, ..., N) (ST2064).

Here, the centering executing part 302 executes centering processing on phase axial processing data of a surface coil Ci at the ith channel, which is calculated by the image reconstruction unit 33 at Step ST2031, on the basis of the displacement $F_{AV1}$ calculated by the displacement calculating part 301 at Step ST2054.

Described specifically, when the surface coil Ci at the ith channel is of the surface coil C1, for example, the centering executing part 302 displaces phase axial processing data D11 shown in FIG. 18(a) by a displacement $F_{AV1}$ in a k space as shown in FIG. 18(b) and thereby executes centering processing thereon. The point at which the signal intensity at the phase axial processing data D1 subsequent to the execution of the centering processing becomes maximum is shifted from the frequency axial center O in the k space by ($F_{AV1}-F_{D01}$). Since, however, the peak of the phase axial processing data passes through the homodyne high pass filter HF and homodyne low pass filter LF, the phase axial processing data D11 is suitably filtered. Even when the surface coil C1 at the ith channel is of the surface coil C2 or C3 in the same manner as described above, the centering executing part 302 displaces phase axial processing data D12 or D13 by the displacement $F_{AV1}$ and thereby executes centering processing thereon. Even in this case, the points at which the signal intensities at the phase axial processing data D12 and D13 become maximum are respectively shifted from the frequency axial center O in the k space by $(F_{AV1}-F_{D02})$, $(F_{AV1}-F_{D03})$. Since, however, the peaks of the phase axial processing data D02 and D03 pass through the homodyne high pass filter HF and homodyne low pass filter LF, the phase axial processing data D12 and D13 are suitably filtered.

When the phase axial processing data D11, D12 and D13 are displaced by the displacement $F_{AV1}$ in the k space as described above, the points at which the signal intensities at the frequency axial processing data become maximum are not displaced to the frequency axial center O in the k space. Since, however, the displaced phase axial processing data D11, D12 and D13 are subjected to the homodyne high pass filter HF and homodyne low pass filter LF placed in the frequency axial center O in the k space, artifacts are almost nonexistent.

In the fourth embodiment of the invention as described above, the differences between the frequencies of points where the signal intensities at respective frequency axial processing data, which are calculated by executing, in a frequency-axis direction, FFT processing on all echo signals received by a plurality of surface coils become maximum, and the frequency at a frequency axial center O in a k space are calculated. The average of the frequency differences at all the frequency axial processing data is calculated. The calculated average value of frequency differences is set as a displacement. Each phase axial processing data is displaced based on the displacement thereby to execute centering processing. Half echo processing is executed on the data subjected to the centering processing thereby to generate an image.

Thus, the fourth embodiment according to the invention calculates displacements for displacing points where the signal intensities at all frequency axial processing data become maximum, to the frequency axial center O in the k space, and displaces all phase axial processing data in the k space on the basis of the average value of all the displacements. Consequently, even though frequency axial processing data affected by noise are contained, these have little effect on the above data. It is thus possible to prevent artifacts of the generated image and enhance image quality.

A fifth embodiment according to the invention will be explained below with reference to FIG. 19.

The fifth embodiment is identical to the second embodiment in terms of portions other than the calculation of the average value of the product of both each integral value and displacement, corresponding to Step ST2055 and the execution of centering processing, corresponding to Step ST2065 in an operation flow. Descriptions of dual parts will therefore be omitted.

A description will be made below of the operation of photographing or imaging a subject 40 using the magnetic resonance imaging apparatus 1 of the present embodiment.

Figure 19:
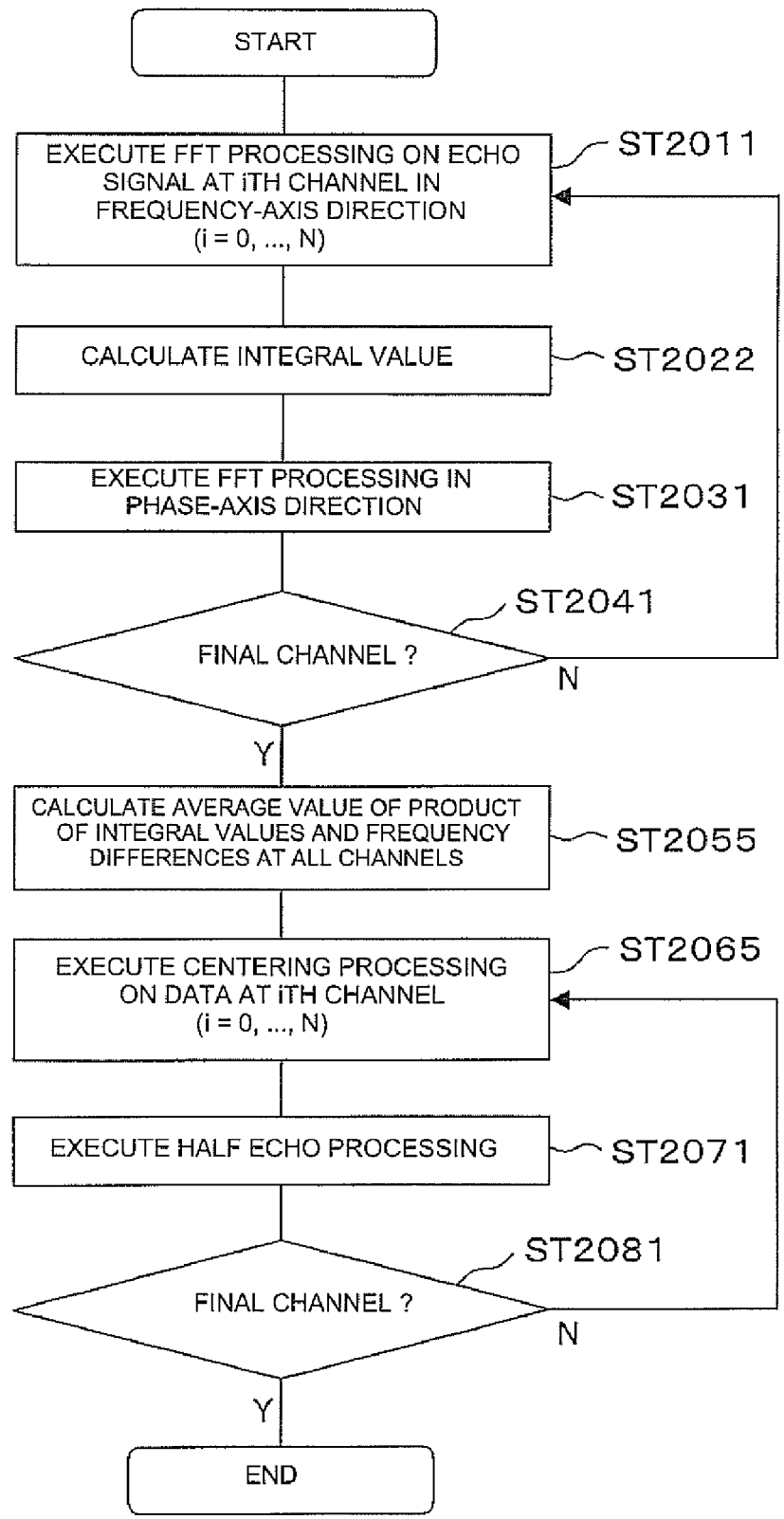
FIG. 19 is a flowchart showing the operation of imaging a subject 40 in a fifth embodiment according to the invention.

FIG. 19 is a flowchart showing the operation of imaging a subject 40 in the fifth embodiment according to the invention. FIGS. 20(a), 20(b), and 20(c) are diagrams illustrating integral values of profiles of frequency axial processing data and frequency differences in the frequency axial processing data in the fifth embodiment according to the invention. FIGS. 21(a) and 21(b) are diagrams showing centering processing on phase axial processing data, based on the average value of the products of both profile's integral values of frequency axial processing data and frequency differences in the frequency axial processing data in the fifth embodiment according to the invention. The vertical axis indicates a signal intensity I, and the horizontal axis indicates a frequency f. A displacement $F_{AV2}$ indicates the average value of the products of both profile's integral values of all frequency axial processing data and displacements.

As shown in FIG. 19, the average value of the product of both integral values and frequency differences at all channels is first calculated (ST2055).

Here, the displacement calculating part 301 calculates a difference between the frequency of a point at which the signal intensity at frequency axial processing data at each channel becomes maximum, and the frequency at a frequency axial center O in a k space. The displacement calculating part 301 calculates the products of both the frequency differences and profile's integral values of the respective frequency axial processing data, and calculates the average value thereof.

Described specifically, as shown in FIG. 20(a) by way of example, the displacement calculating part 301 calculates a frequency difference $F_{D01}$ between the frequency of a point where the signal intensity at frequency axial processing data D01 becomes maximum, and the frequency at the frequency axial center O in the k space. The displacement calculating part 301 calculates $(S_{D01} \times F_{D01})$ corresponding to the product of an integral value of a profile at the frequency axial processing data D01, and the frequency difference thereat.

Similarly, the displacement calculating part 301 calculates the product $(S_{D02} \times F_{D02})$ of both an integral value of a profile at frequency axial processing data D02 and a frequency difference thereat, and the product $(S_{D03} \times F_{D03})$ of both an integral value of a profile at frequency axial processing data D03 and a frequency difference thereat.

Next, the average value of the products of both integral values of profiles of all frequency axial processing data and frequency differences thereat is calculated. The average value of the products of both the integral values and frequency differences is set as a displacement for displacing all phase axial processing data.

For example, the average value of the products of both integral values of profiles at the frequency axial processing data D01, D02 and D03 and frequency differences thereat is calculated. The average value is set as a displacement $F_{AV2}$ for phase axial processing data at all channels. Since the peak positions of the frequency axial processing data and phase axial processing data remain unchanged here, the displacement $F_{AV2}$ can be used as the displacement for displacing the phase axial processing data. The displacement $F_{AV2}$ corresponding to the average value of the products of both the maximum values and frequency differences is calculated by the following equation (2):

$$F_{AV2} = \frac{\sum_{i=1}^{n} S_{D0i} \times F_{D0i}}{\sum_{i=1}^{n} S_{D0i}} \quad (2)$$

where $S_{D0i}$: integral value of profile at frequency axial processing data D0i, and $F_{D0i}$: frequency difference in frequency axial processing data D0i Next, as shown in FIG. 19, centering processing on data at an ith channel is executed (i=0, . . . , N) (ST2065).

Here, the centering executing part 302 executes centering processing on phase axial processing data of a surface coil Ci at the ith channel, based on the displacement $F_{AV2}$ calculated by the displacement calculating part 301 at Step ST2055.

Described specifically, when the surface coil Ci at the ith channel is of the surface coil C1, for example, the centering executing part 302 displaces phase axial processing data D11 shown in FIG. 21(a) by the displacement $F_{AV2}$ in a k space as shown in FIG. 21(b) and thereby executes centering processing on the phase axial processing data D11. In this case, the peak of the phase axial processing data D11 is shifted from the frequency axial center O in the k space by $(F_{AV2}-F_{D01})$. Since, however, it passes through the homodyne high pass filter HF and homodyne low pass filter LF, the phase axial processing data D11 is suitably filtered. Even when the surface coil C1 at the ith channel is of the surface coil C2 or C3, the centering executing part 302 displaces phase axial processing data D12 or D13 by the displacement $F_{AV2}$ in a manner similar to the phase axial processing data D11 and thereby executes centering processing thereon. Even in this case, the peaks of the phase axial processing data D12 and D13 are shifted from the frequency axial center O in the k space by $(F_{AV2}-F_{D02})$, $(F_{AV2}-F_{D03})$. Since, however, the peaks thereof pass through the homodyne high pass filter HF and homodyne low pass filter LF, the phase axial processing data D12 and D13 are suitably filtered.

In the fifth embodiment of the invention as described above, the integral values of profiles at respective frequency axial processing data calculated by executing, in a frequency-axis direction, FFT processing on all echo signals received by a plurality of surface coils are calculated. The differences between the frequencies at which the signal intensities at the respective frequency axial processing data become maximum, and the frequency at a frequency axial center O in a k space are calculated. The products of both the integral values of profiles at the respective frequency axial processing data and the frequency differences thereat are calculated. The average value of the products of both the integral values of the profiles at all echo signals and the frequency differences thereat is calculated. The calculated average value is set as a displacement. Each phase axial processing data is displaced based on the displacement to execute centering processing. Half echo processing is executed on the data subjected to the centering processing thereby to generate an image.

Thus, the fifth embodiment according to the invention displaces all phase axial processing data in the k space, based on the average value of the products of both integral values of profiles at all frequency axial processing data and frequency differences thereat. Consequently, even though phase axial processing data affected by noise are contained, these have little effect on the above data. It is thus possible to prevent artifacts of the generated image and enhance image quality.

A sixth embodiment according to the invention will be explained below with reference to FIG. 22.

The sixth embodiment is identical to the first embodiment in terms of portions other than the calculation of the average value of the product of both each integral value and displacement, corresponding to Step ST2056 and the execution of centering processing, corresponding to Step ST2066 in an operation flow. Descriptions of dual parts will therefore be omitted.

A description will be made below of the operation of photographing or imaging a subject 40 using the magnetic resonance imaging apparatus 1 of the present embodiment.

Figure 22:
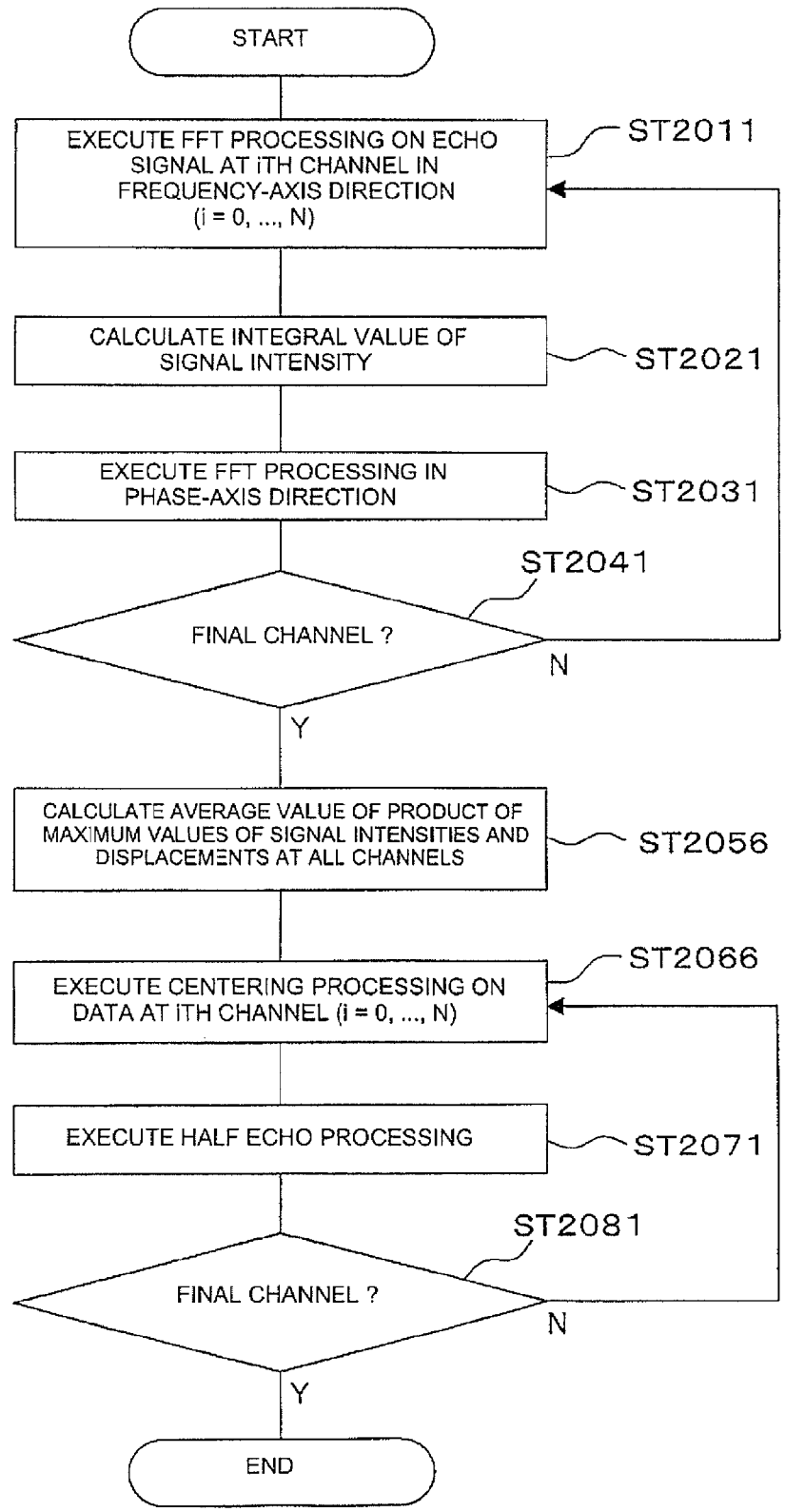
FIG. 22 is a flowchart illustrating the operation of imaging a subject 40 in a sixth embodiment according to the invention.
Figure 23:
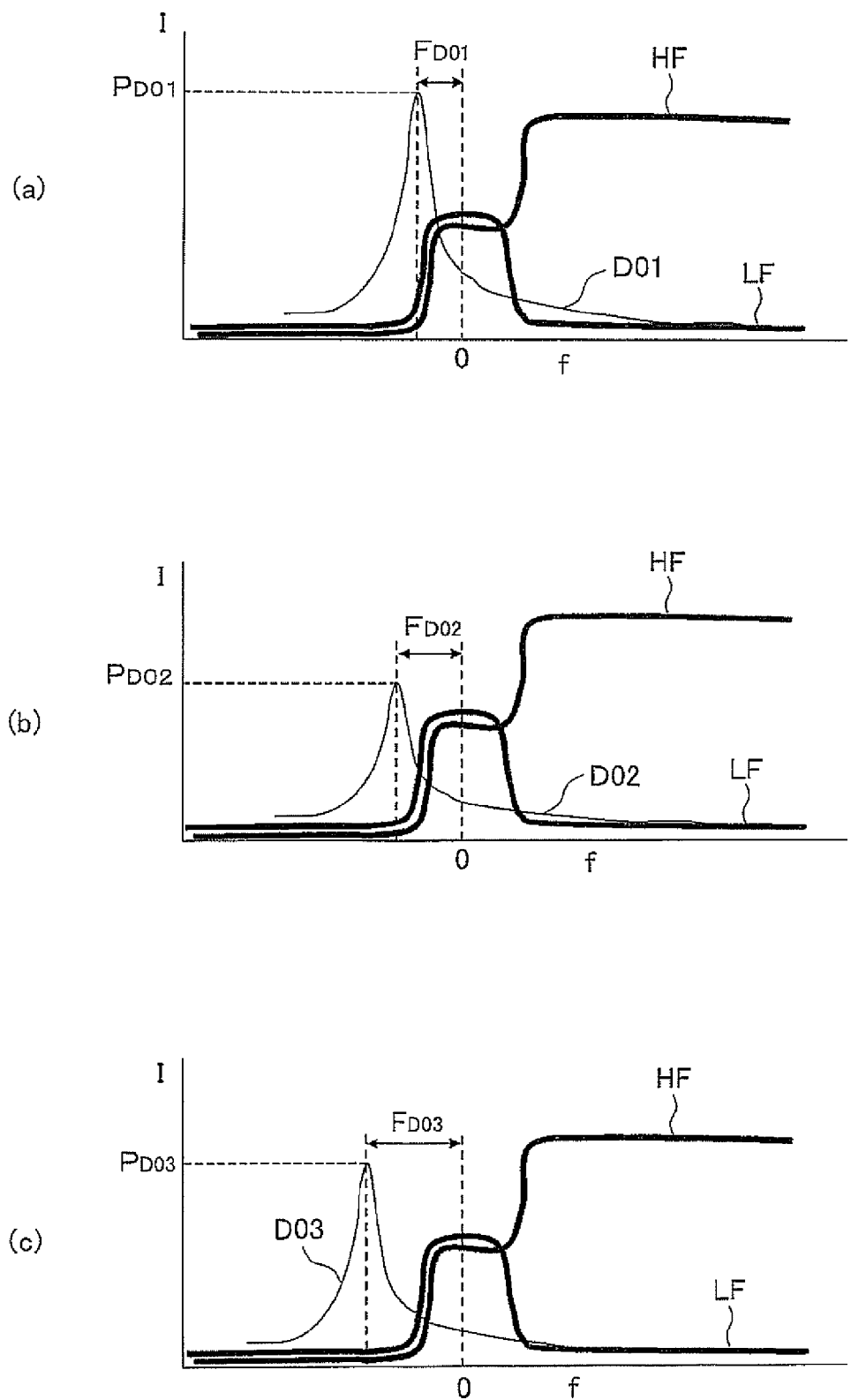
FIGS. 23(a), 23(b), and 23(c) are diagrams showing the maximum value of signal intensities of frequency axial processing data and frequency differences in the frequency axial processing data in the sixth embodiment according to the invention.

FIG. 22 is a flowchart showing the operation of imaging a subject 40 in the sixth embodiment according to the invention. FIGS. 23(a), 23(b), and 23(c) are diagrams showing the maximum value of signal intensities of frequency axial processing data and frequency differences in the frequency axial processing data in the sixth embodiment according to the invention. The vertical axis indicates a signal intensity I, and the horizontal axis indicates a frequency f.

FIGS. 24(a) and 24(b) are diagrams illustrating centering processing on phase axial processing data, based on the average value of the product of both the maximum value of signal intensities of frequency axial processing data and each frequency difference in the frequency axial processing data in the sixth embodiment according to the invention. The vertical axis indicates a signal intensity I, and the horizontal axis indicates a frequency f. A displacement $F_{AV3}$ indicates the average value of the products of both maximum values and displacements of all frequency axial processing data.

As shown in FIG. 22, the average value of the products of both maximum values of signal intensities and frequency differences at all channels is first calculated (ST2056).

Here, the displacement calculating part 301 calculates a difference between the frequency of a point at which the signal intensity at frequency axial processing data at each channel becomes maximum and the frequency at a frequency axial center O in a k space. The displacement calculating part 301 calculates the products of both the frequency differences and the maximum values of the signal intensities of the respective frequency axial processing data, which are calculated at Step ST2021, and calculates the average value of the products of the frequency differences and the maximum values of the signal intensities.

Described specifically, as shown in FIG. 23(a) by way of example, the displacement calculating part 301 calculates a frequency difference $F_{D01}$ between the frequency of a point where the signal intensity at frequency axial processing data D01 becomes maximum ($P_{D01}$), and the frequency at the frequency axial center O in the k space. The displacement calculating part 301 calculates ($P_{D01} \times F_{D01}$) corresponding to the product of both the maximum value of a signal intensity at the frequency axial processing data D01, and the frequency difference thereat.

Similarly, the displacement calculating part 301 calculates the product ($P_{D02} \times F_{D02}$) of both the maximum value of a signal intensity at frequency axial processing data D02 and a frequency difference thereat, and the product ($P_{D03} \times F_{D03}$) of both the maximum value at frequency axial processing data D03 and a frequency difference thereat.

Next, the average value of the products of both maximum values at all frequency axial processing data and frequency differences thereat is calculated. The average value of the products of both the maximum values and the frequency differences is set as a displacement for displacing all phase axial processing data.

For example, the average value of the products of both the maximum values and frequency differences at the frequency axial processing data D01, D02 and D03 is calculated. The average value is set as a displacement $F_{AV3}$ for phase axial processing data at all channels. Since the peak positions of the frequency axial processing data and phase axial processing data remain unchanged here, the displacement $F_{AV3}$ can be used as the displacement for displacing the phase axial processing data. The displacement $F_{AV3}$ corresponding to the average value of the products of both the maximum values and frequency differences is calculated by the following equation (3):

$$F_{AV3} = \frac{\sum_{i=1}^{n} P_{D0i} \times F_{D0i}}{\sum_{i=1}^{n} P_{D0i}} \qquad (3)$$

where $P_{D0i}$: maximum value of frequency axial processing data D0$i$, and $F_{D0i}$: frequency difference in frequency axial processing data D0$i$ Next, as shown in FIG. 22, centering processing on data at an ith channel is executed (i=0, ..., N) (ST2066).

Here, the centering executing part 302 executes centering processing on phase axial processing data of a surface coil Ci at the ith channel, based on the displacement $F_{AV3}$ calculated by the displacement calculating part 301 at Step ST2056.

Figure 24:
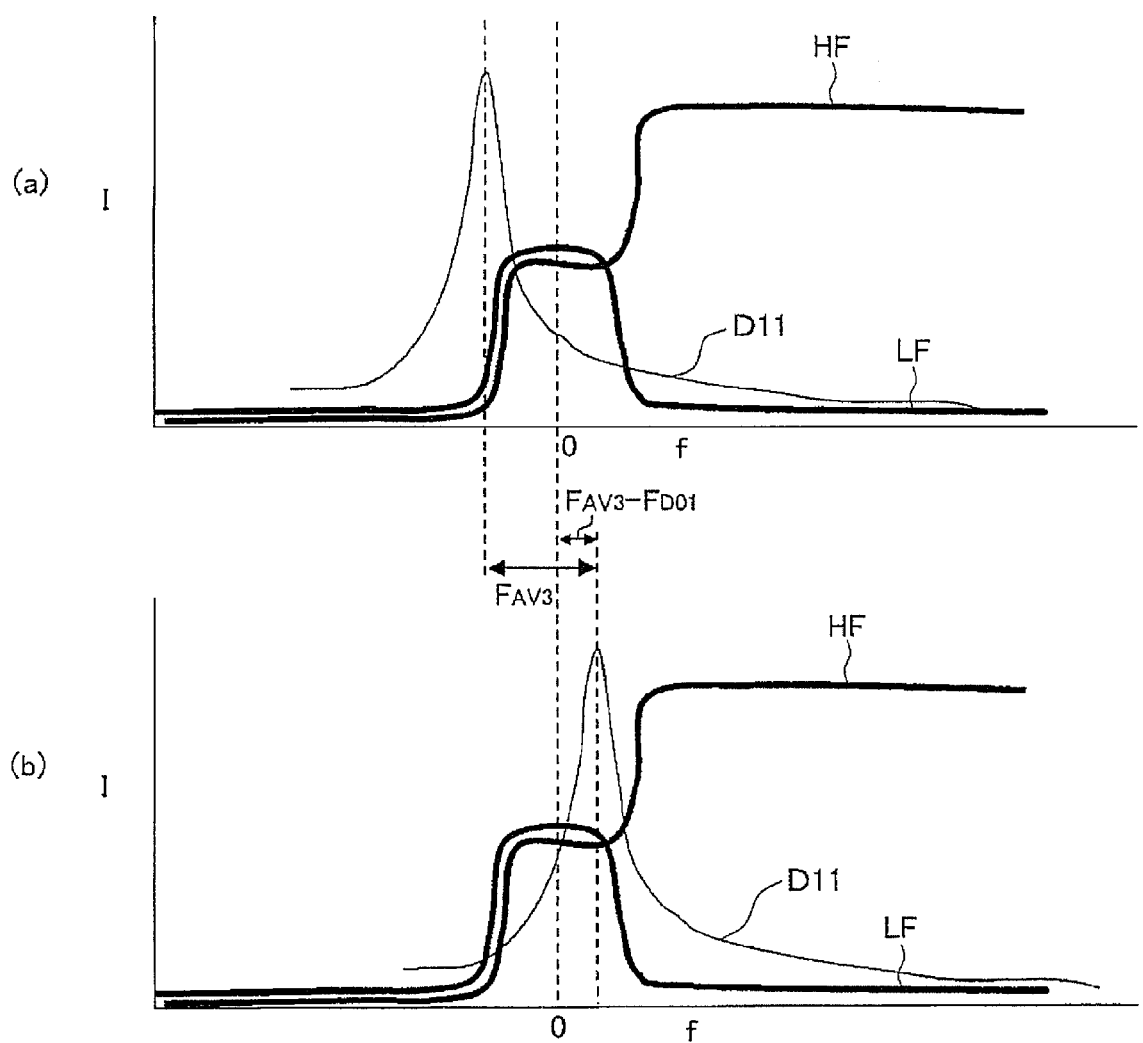
FIGS. 24(a) and 24(b) are diagrams illustrating centering processing on phase axial processing data, based on the average value of the product of both the maximum value of signal intensities of frequency axial processing data and each frequency difference in the frequency axial processing data in the sixth embodiment according to the invention.

Described specifically, when the surface coil Ci at the ith channel is of the surface coil C1, for example, the centering executing part 302 displaces phase axial processing data D11 shown in FIG. 24(*a*) by the displacement $F_{AV3}$ in a k space as shown in FIG. 24(*b*) and thereby executes centering processing on the phase axial processing data D11. In this case, the peak of the phase axial processing data D11 is shifted from the frequency axial center O in the k space by ($F_{AV3} - F_{D01}$). Since, however, it passes through the homodyne high pass filter HF and homodyne low pass filter LF, the phase axial processing data D11 is suitably filtered. Even when the surface coil C1 at the ith channel is of the surface coil C2 or C3, the centering executing part 302 displaces phase axial processing data D12 or D13 by the displacement $F_{AV3}$ in a manner similar to the phase axial processing data D11 and thereby executes centering processing thereon. Even in this case, the peaks of the phase axial processing data D12 and D13 are shifted from the frequency axial center O in the k space by ($F_{AV3} - F_{D02}$), ($F_{AV3} - F_{D03}$), respectively. Since, however, the peaks thereof pass through the homodyne high pass filter HF and homodyne low pass filter LF, the phase axial processing data D12 and D13 are suitably filtered.

In the sixth embodiment of the invention as described above, the maximum values of signal intensities at respective frequency axial processing data calculated by executing, in a frequency-axis direction, FFT processing on all echo signals received by a plurality of surface coils are calculated. The differences between the frequencies at which the signal intensities at the respective frequency axial processing data become maximum, and the frequency at a frequency axial center in a k space are calculated. The products of both the maximum values of the signal intensities at the respective frequency axial processing data and the frequency differences thereat are calculated. The average value of the products of both the maximum values of the signal intensities at all echo signals and the frequency differences thereat is calculated. The calculated average value is set as a displacement. Each phase axial processing data is displaced based on the displacement to execute centering processing. Half echo processing is executed on the data subjected to the centering processing thereby to generate an image.

Thus, the sixth embodiment according to the invention displaces all phase axial processing data in the k space, based on the average value of the products of both the maximum values of signal intensities at all frequency axial processing data and frequency differences thereat. Consequently, even though phase axial processing data affected by noise are contained, these have little effect on the above data. It is thus possible to prevent artifacts of the generated image and enhance image quality.

A seventh embodiment according to the invention will be explained below with reference to FIG. 25.

The seventh embodiment is identical to the first embodiment in terms of portions other than the calculation of the medium or median values of displacements at all channels, corresponding to Step ST2057, and the execution of centering processing, corresponding to Step ST2067 in an operation flow. Descriptions of dual parts will therefore be omitted.

A description will be made below of the operation of photographing or imaging a subject 40 using the magnetic resonance imaging apparatus 1 of the present embodiment.

Figure 25:
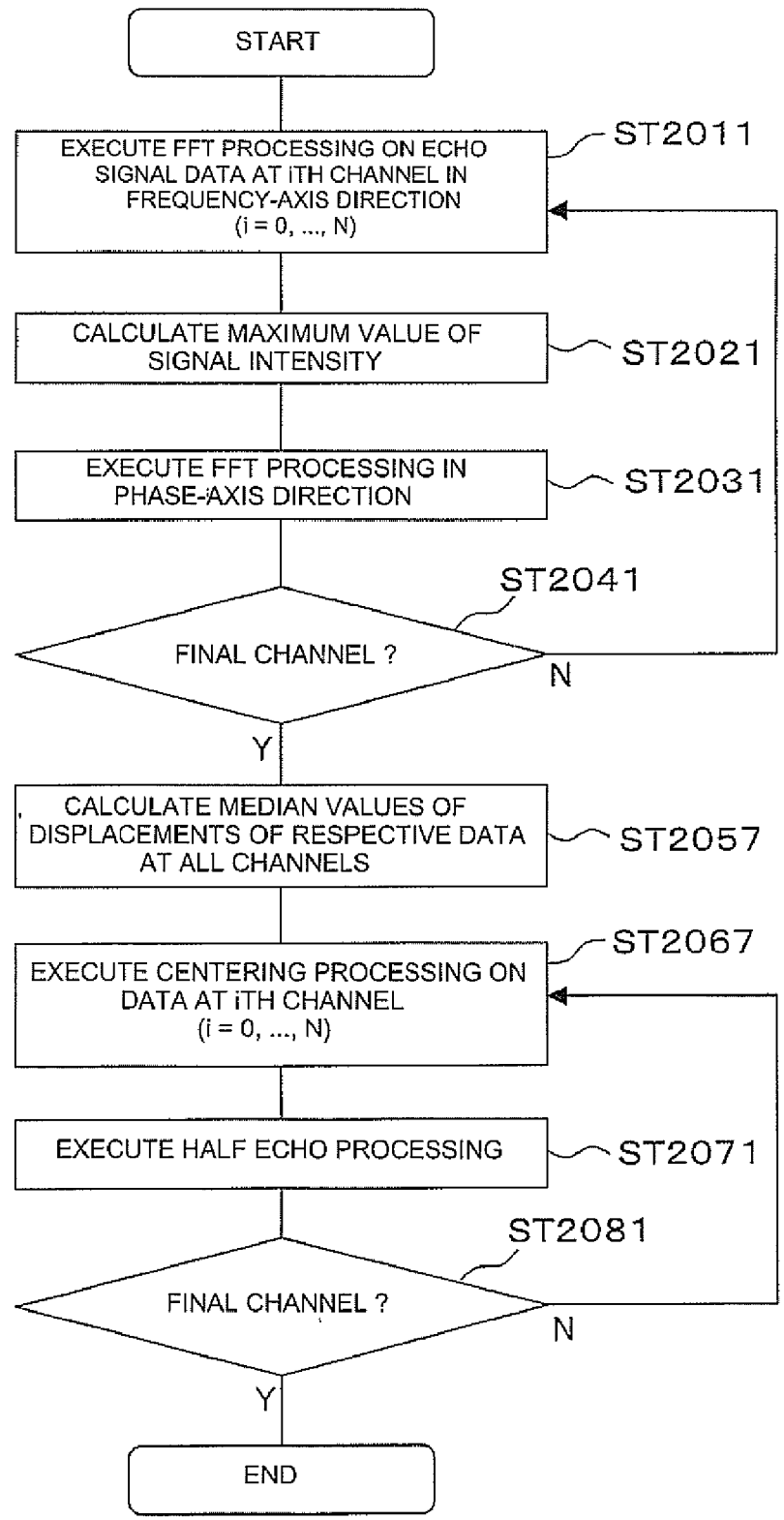
FIG. 25 is a flowchart showing the operation of imaging a subject 40 in a seventh embodiment according to the invention.
Figure 26:
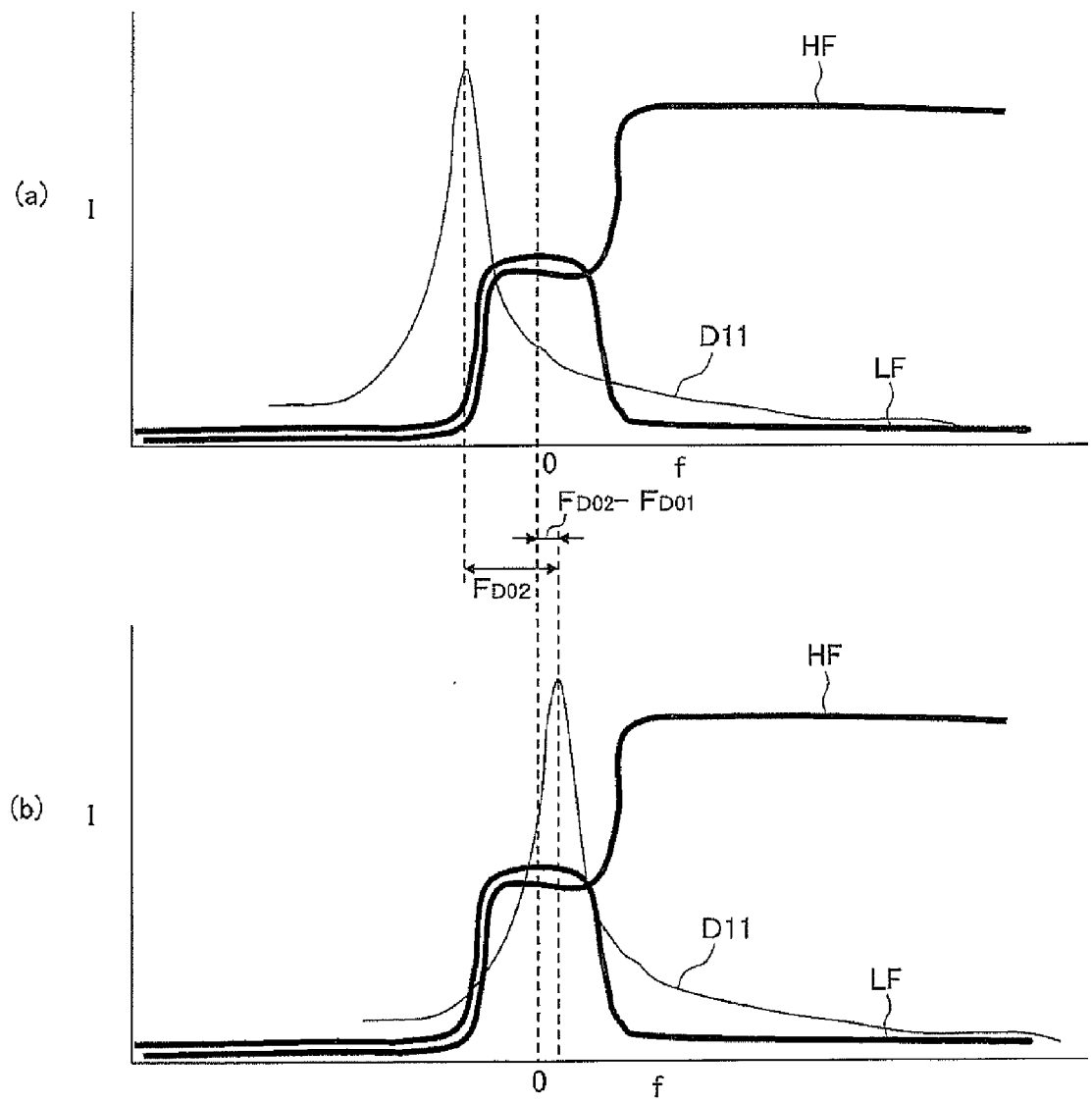
FIGS. 26(a) and 26(b) are diagrams depicting centering processing on phase axial processing data, based on the median values of displacements for displacing respective frequency axial processing data to a frequency axial center O in the seventh embodiment according to the invention.

FIG. 25 is a flowchart showing the operation of imaging the subject 40 in the seventh embodiment according to the invention. FIGS. 26(*a*) and 26(*b*) are diagrams depicting centering processing on phase axial processing data, based on the median values of displacements for displacing respective frequency axial processing data to a frequency axial center O in the seventh embodiment according to the invention. The vertical axis indicates a signal intensity I, and the horizontal axis indicates a frequency f.

As shown in FIG. 25, the medium or median values of displacements of respective data at all channels are first calculated (ST2057).

Here, the displacement calculating part 301 calculates a difference between the frequency of a point at which the signal intensity at frequency axial processing data at each channel becomes maximum, and the frequency at a frequency axial center O in a k space. The displacement calculating part 301 calculates a median value corresponding to a frequency difference brought to the center when the frequency differences at the frequency axial processing data at all channels are arranged in ascending order or descending order.

Figure 20:
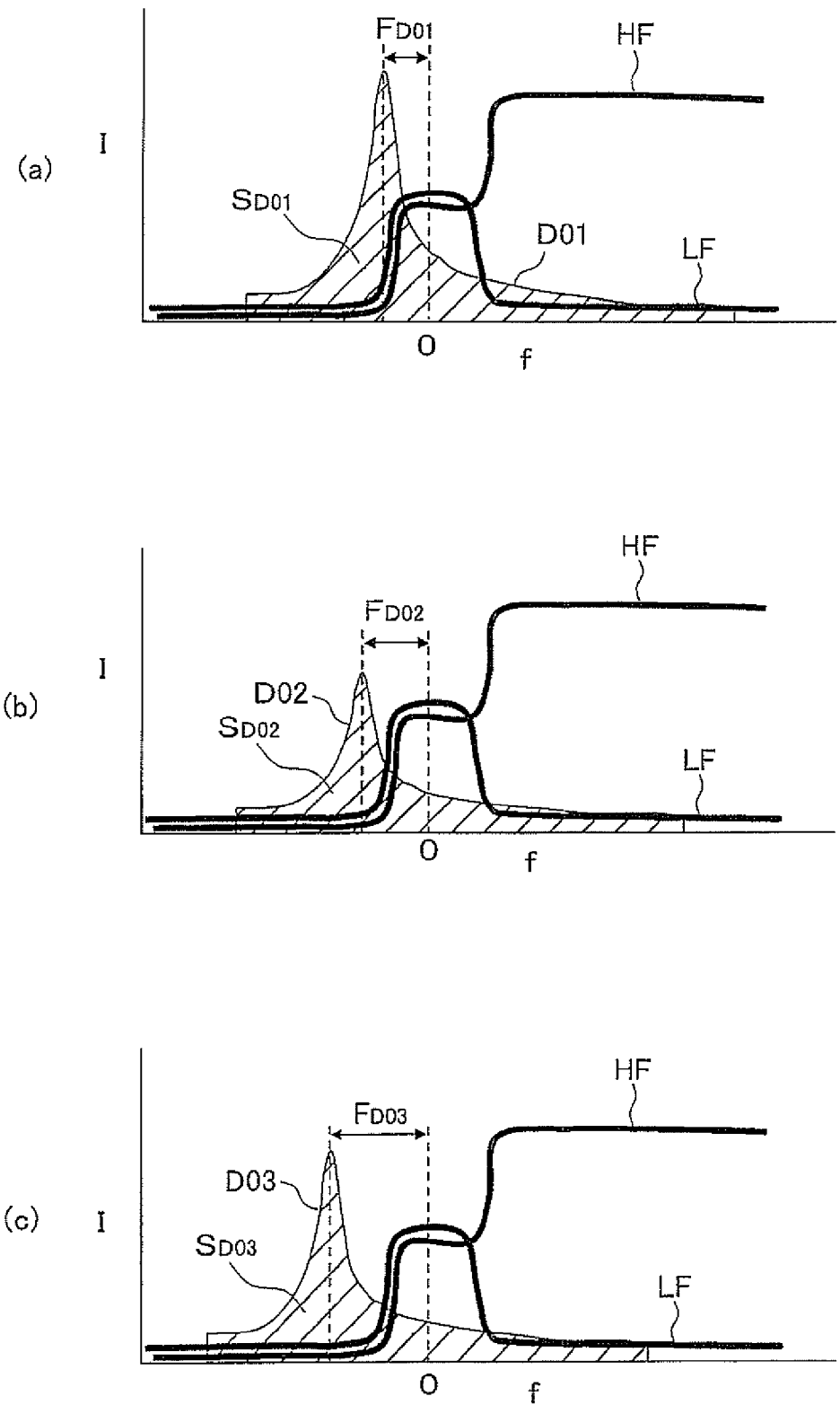
FIGS. 20(a), 20(b), and 20(c) are diagrams illustrating integral values of profiles of frequency axial processing data and frequency differences in the frequency axial processing data in the fifth embodiment according to the invention.
Figure 21:
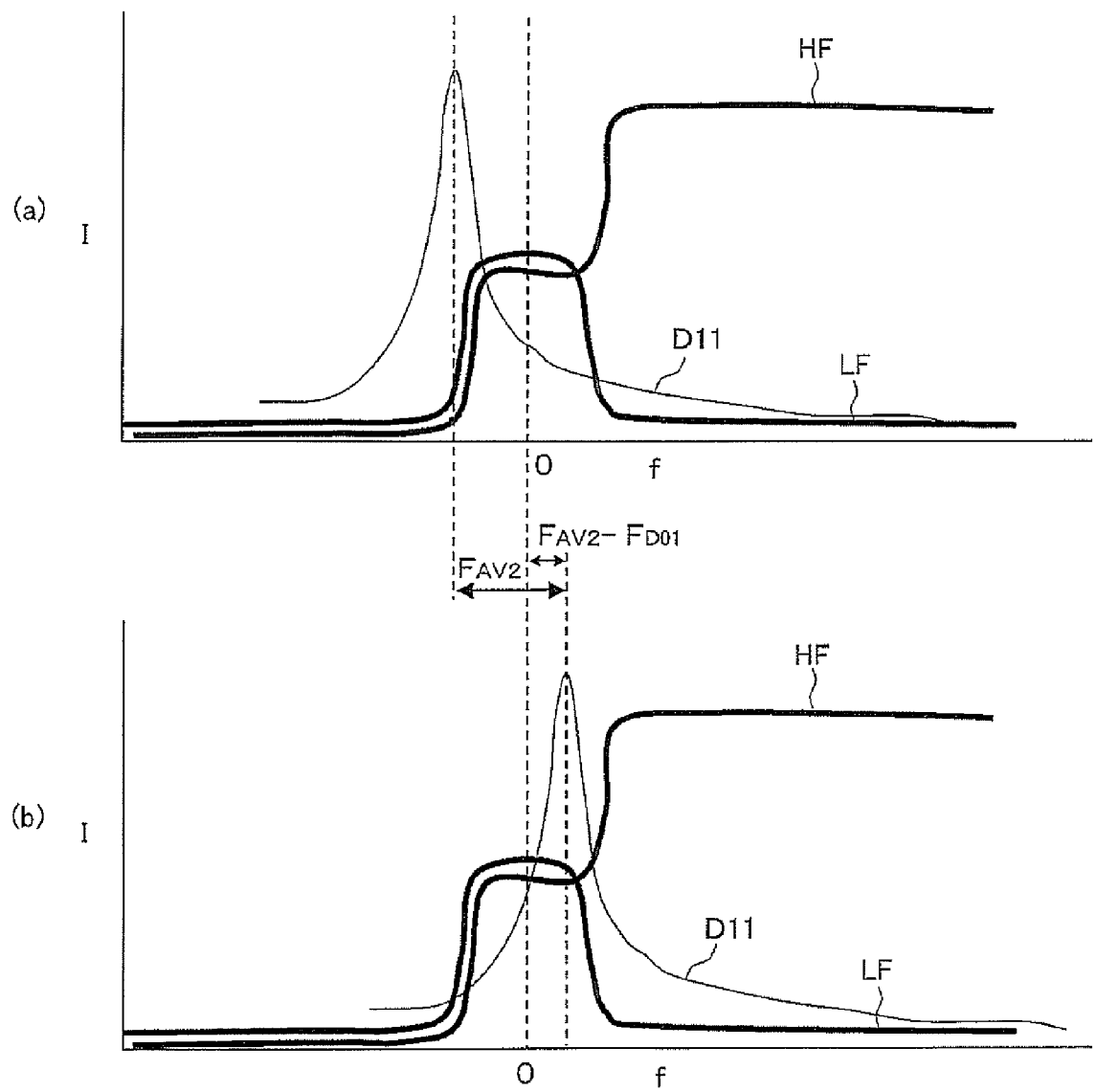
FIGS. 21(a) and 21(b) are diagrams showing centering processing on phase axial processing data, based on the average value of the products of both profile integral values of frequency axial processing data and frequency differences in the frequency axial processing data in the fifth embodiment according to the invention.

Described specifically, as shown in FIG. 20 by way of example, the displacement calculating part 301 calculates a frequency difference $F_{D01}$ between the frequency of a point where the signal intensity at frequency axial processing data D01 becomes maximum ($P_{D01}$), and the frequency at the frequency axial center O in the k space.

Similarly, the displacement calculating part 301 calculates a frequency difference $F_{D02}$ at frequency axial processing data D02 and a frequency difference $F_{D03}$ at frequency axial processing data D03.

Next, the displacement calculating part 301 calculates the median values of frequency differences at all frequency axial processing data and sets the median values as displacements for displacing all phase axial processing data.

When the magnitude of the frequency difference is taken as $F_{D01} < F_{D02} < F_{D03}$ as shown in FIG. 20, for example, the median value of the frequency difference becomes the frequency difference $F_{D02}$. The frequency difference $F_{D02}$ corresponding to the median value is set as a displacement for displacing all phase axial processing data.

Next, as shown in FIG. 25, centering processing on data at an ith channel is executed (i=0, ..., N) (ST2067).

Here, the centering executing part 302 executes centering processing on phase axial processing data of a surface coil Ci at the ith channel, based on the displacement calculated by the displacement calculating part 301 at Step ST2057.

Described specifically, when the surface coil Ci at the ith channel is of the surface coil C1 as shown in FIG. 26(*a*), for example, the centering executing part 302 displaces phase axial processing data D11 shown in FIG. 26(*a*) by the displacement $F_{D02}$ in a k space as shown in FIG. 26(*b*) and thereby executes centering processing on the phase axial processing data D11. In this case, the peak of the phase axial processing data D11 is shifted from the frequency axial center O in the k space by ($F_{D02}-F_{D01}$). Since, however, it passes through the homodyne high pass filter HF and homodyne low pass filter LF, the phase axial processing data D11 is suitably filtered.

The centering executing part 302 displaces even phase axial processing data D12 and D13 in the k space, based on the displacement $F_{D02}$ in the same manner as described above and thereby executes centering processing thereon. Since the peaks of the phase axial processing data D12 and D13 pass through the homodyne high pass filter HF and homodyne low pass filter LF lying in the frequency axial center O in the k space even in this case, the phase axial processing data D12 and D13 are suitably filtered.

In the seventh embodiment of the invention as described above, the maximum values of signal intensities at respective frequency axial processing data calculated by executing, in a frequency-axis direction, FFT processing on all echo signals received by a plurality of surface coils are calculated. The differences between the frequencies at which the signal intensities at the respective frequency axial processing data become maximum, and the frequency at a frequency axial center O in a k space are calculated. The median value of each of the frequency differences at the frequency axial processing data at all channels is calculated. The median value is set as a displacement for displacing all frequency axial processing data. Each phase axial processing data is displaced based on the calculated displacement to execute centering processing. Half echo processing is executed on the data subjected to the centering processing thereby to generate an image.

Thus, the median values of the frequency differences at the frequency axial processing data at all channels are set as the displacements for displacing the frequency axial processing data. Consequently, the peak values of all frequency axial processing data are displaced to near the frequency axial center O in the k space. Therefore, all phase axial processing data are displaced in the k space, based on the median values of the frequency differences at the frequency axial processing data at all the channels, whereby artifacts of the generated image can be prevented. It is thus possible to enhance image quality.

In eighth embodiment according to the invention will be explained below with reference to FIG. 27.

The eighth embodiment is identical to the first embodiment in terms of portions other than the calculation of the average value of the products of maximum values and displacements, corresponding to Step ST2058, and the execution of centering processing, corresponding to Step ST2068 in an operation flow. Descriptions of dual parts will therefore be omitted.

A description will be made below of the operation of photographing or imaging a subject 40 using the magnetic resonance imaging apparatus 1 of the present embodiment.

Figure 27:
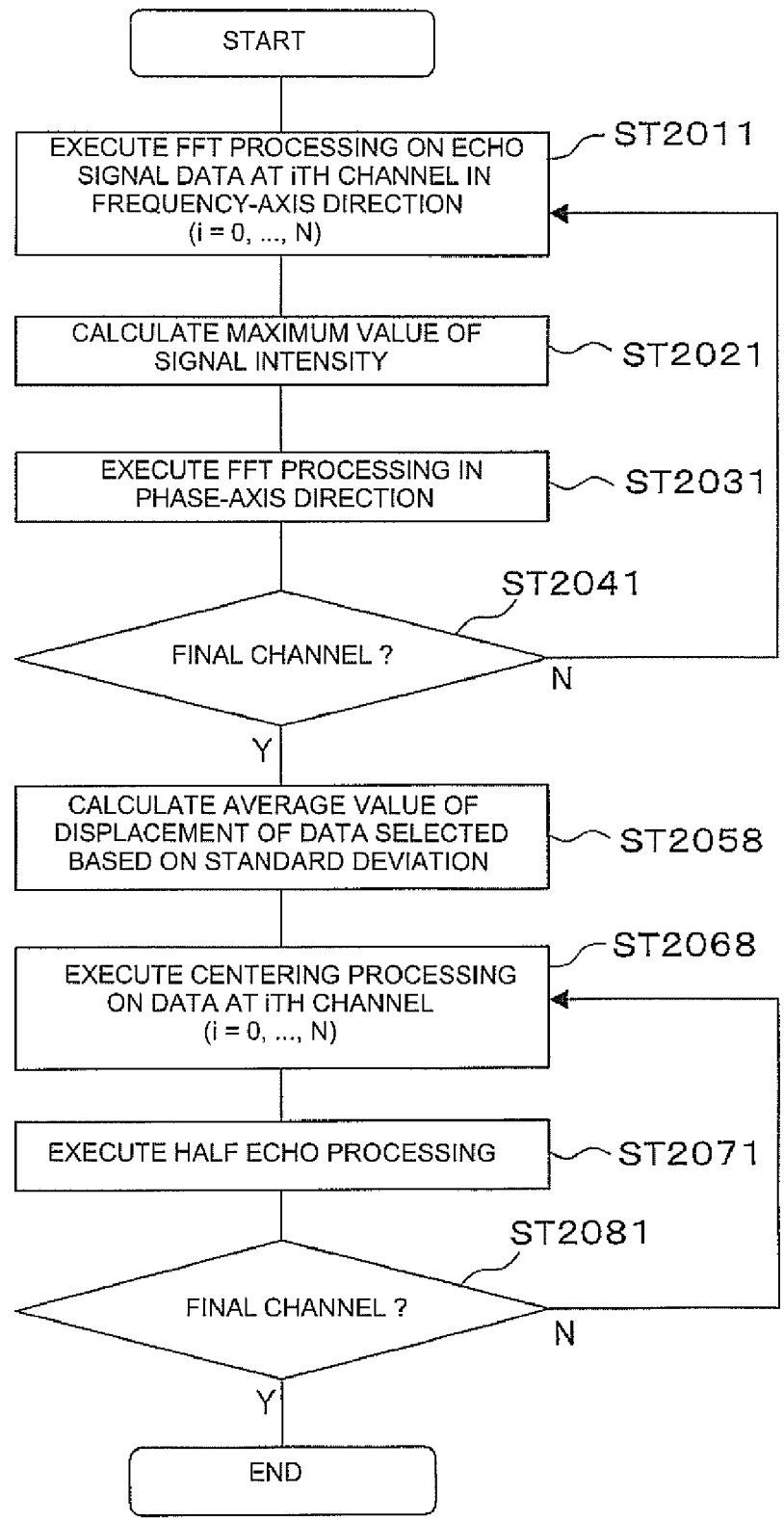
FIG. 27 is a flowchart showing the operation of imaging a subject 40 in an eighth embodiment according to the invention.
Figure 28:
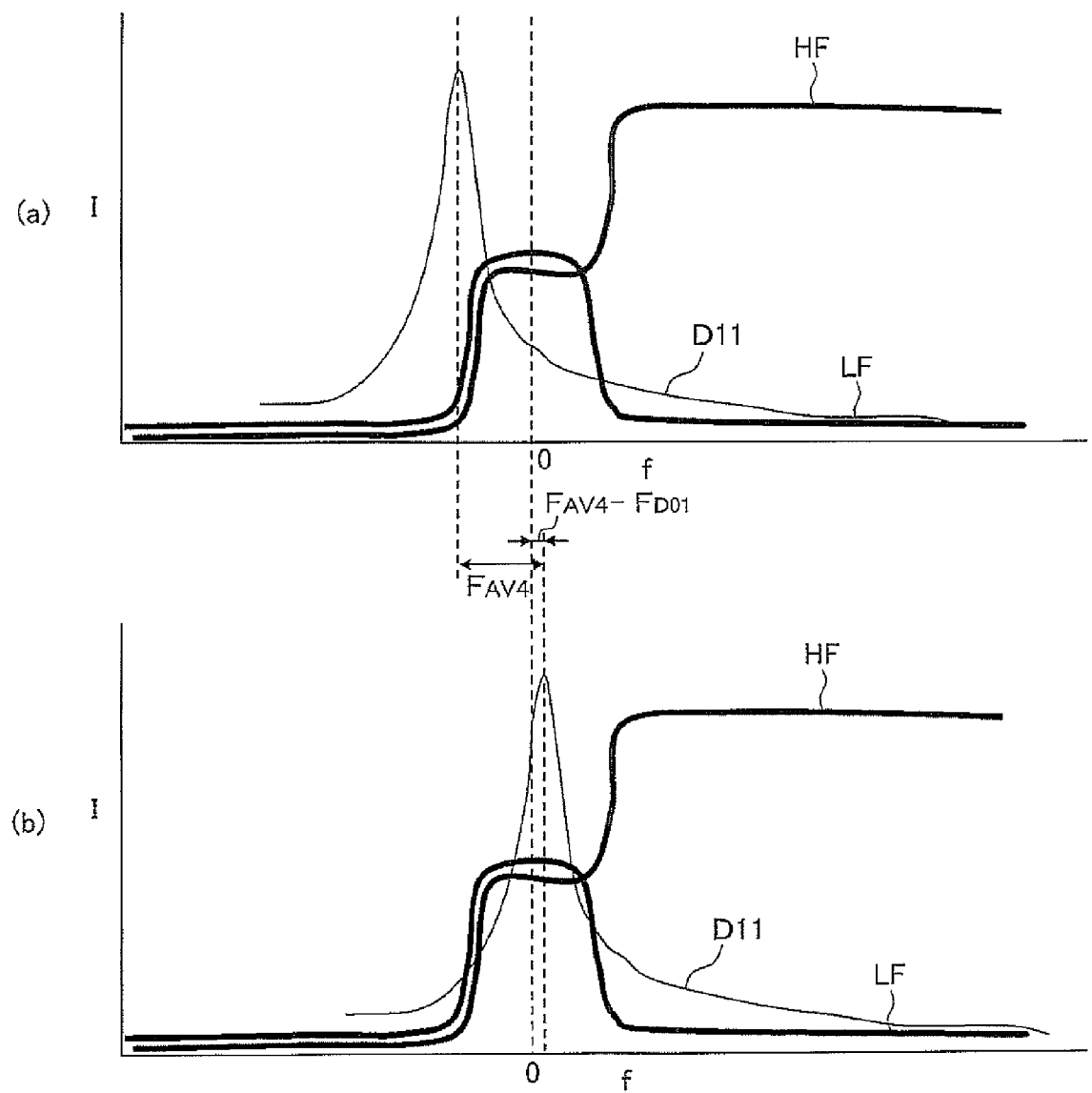
FIGS. 28(a) and 28(b) are diagrams illustrating centering processing on phase axial processing data by the average value of a selected frequency difference, based on the standard deviation of a difference between the frequency of a point at which the signal intensity of each frequency axial processing data becomes maximum, and the frequency at a frequency axial center O in a k space.
Figure 29:
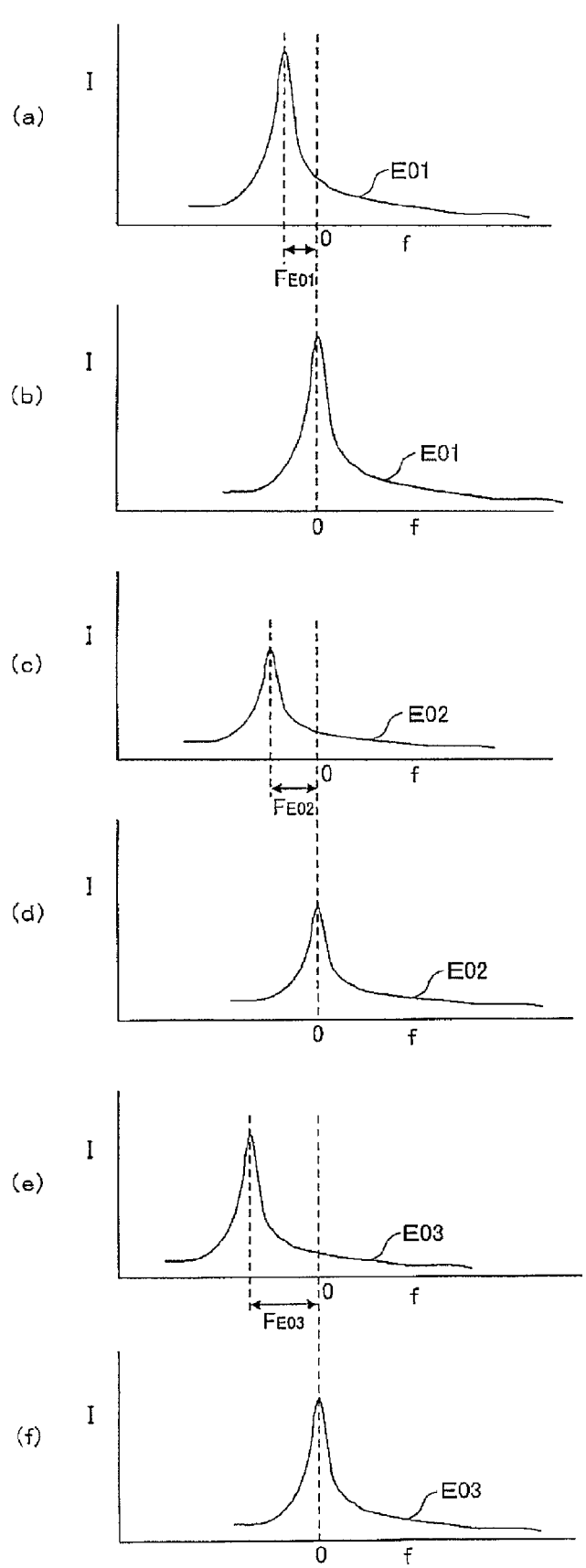
FIGS. 29(a)-29(f) are diagrams for describing a prior art.
Figure 31:
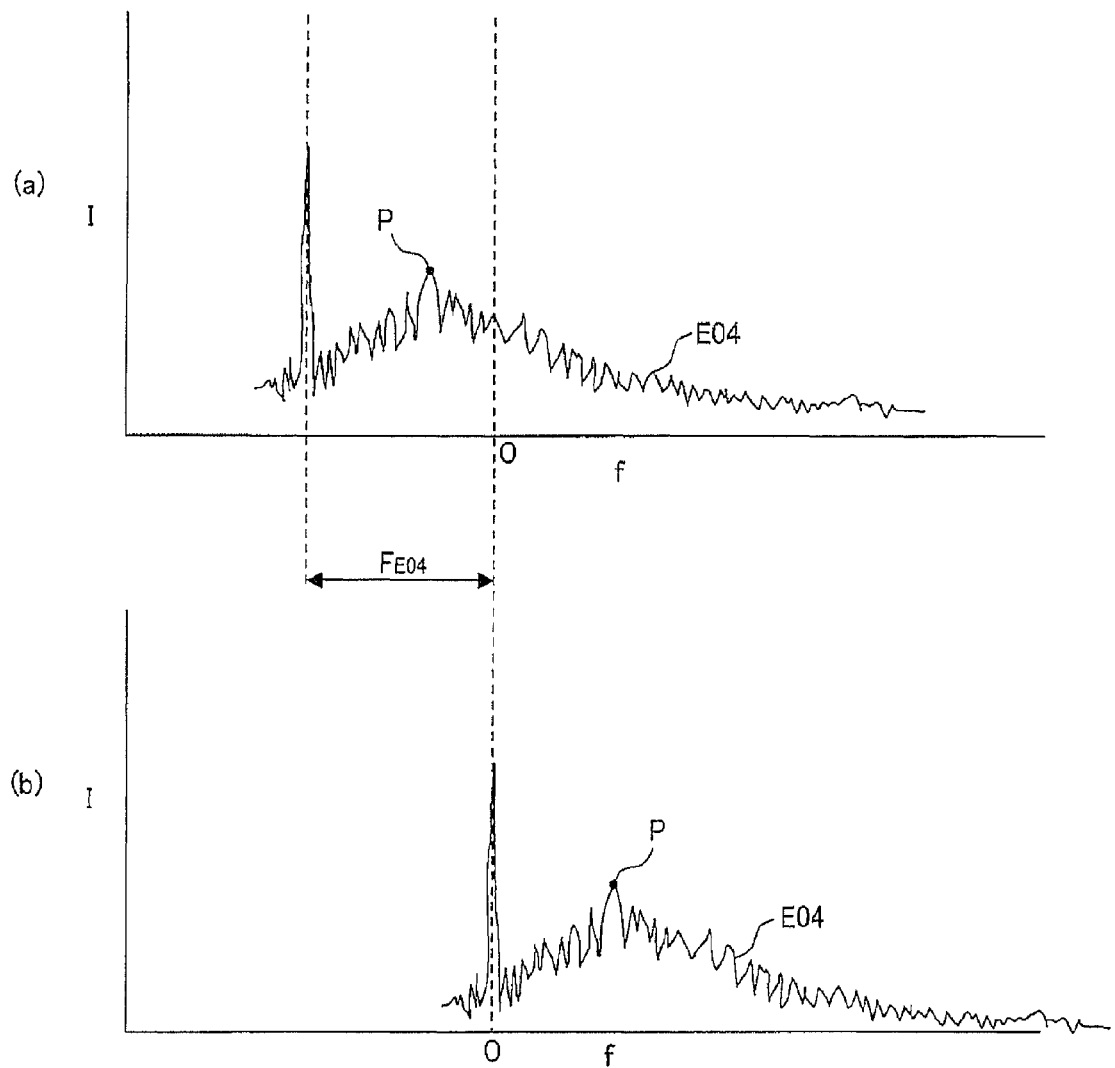
FIGS. 31(a) and 31(b) are diagrams for describing a prior art.

FIG. 27 is a flowchart showing the operation of imaging the subject 40 in the eighth embodiment according to the invention. FIGS. 28(a) and 28(b) are diagrams illustrating centering processing on phase axial processing data by the average value of a selected frequency difference, based on the standard deviation of a difference between the frequency of a point at which the signal intensity of each frequency axial processing data becomes maximum, and the frequency at a frequency axial center O in a k space. The vertical axis indicates a signal intensity I, and the horizontal axis indicates a frequency f. A displacement $F_{AV4}$ indicates the average value of the frequency difference selected based on the standard deviation.

As shown in FIG. 27, the average value of a displacement of each data selected based on the standard deviation is first calculated (ST2058).

Here, the displacement calculating part 301 calculates a difference between the frequency of a point at which the signal intensity at frequency axial processing data at each channel becomes maximum, and the frequency at a frequency axial center O in a k space. The displacement calculating part 301 calculates the standard deviations of frequency differences at the frequency axial processing data at all channels. The corresponding frequency difference is selected based on the standard deviations, and the average value of the selected frequency difference is calculated.

Described specifically, as shown in FIG. 20 by way of example, the displacement calculating part 301 calculates a frequency difference $F_{D01}$ between the frequency of a point where the signal intensity at frequency axial processing data D01 becomes maximum ($P_{D01}$), and the frequency at the frequency axial center O in the k space.

Similarly, the displacement calculating part 301 calculates a frequency difference $F_{D02}$ at frequency axial processing data D02 and a frequency difference $F_{D03}$ at frequency axial processing data D03.

Next, the displacement calculating part 301 calculates the standard deviations of frequency differences at all frequency axial processing data and selects the corresponding frequency difference out of all frequency differences, based on the standard deviations.

For example, the arithmetic average value of frequency differences at the frequency axial processing data D01, D02 and D03 and a standard deviation σ thereof are calculated. A frequency difference indicative of |frequency difference−arithmetic average value|<2σ is selected. The average value of the selected frequency difference is set as a displacement $F_{AV4}$ for phase axial processing data at all channels. When, for example, the frequency axial processing data indicative of |frequency difference−arithmetic average value|<2σ is taken as D01 and D02 at the frequency axial processing data D01, D02 and D03, the displacement results in $F_{AV4}=(F_{D01}+F_{D02})/2$.

Since the peak positions of the frequency axial processing data and phase axial processing data remain unchanged here, the displacement $F_{AV4}$ can be used as the displacement for displacing the phase axial processing data. The standard deviation of the frequency difference is calculated by the following equation (4):

$$\sigma = \sqrt{\frac{\sum_{i=1}^{n}(x_i - \bar{x})^2}{n}} \quad (4)$$

where $x_i$: frequency difference, and $\bar{x}$: arithmetic average of $x=\{x_i\}$ Next, as shown in FIG. 27, centering processing on data at an ith channel is executed (i=0, . . . , N) (ST2068).

Here, centering processing is executed on phase axial processing data of a surface coil Ci at the ith channel, based on the displacement calculated by the displacement calculating part 301 at Step ST2058.

Described specifically, when the surface coil Ci at the ith channel is of the surface coil C1 as shown in FIG. 28(a), for example, phase axial processing data D11 shown in FIG. 28(a) is displaced by the displacement $F_{D04}$ in a k space as shown in FIG. 28(b), thereby executing centering processing on the phase axial processing data D11. In this case, the peak of the phase axial processing data D11 is shifted from the frequency axial center O in the k space by $(F_{AV4}-F_{D01})$. Since, however, it passes through the homodyne high pass filter HF and homodyne low pass filter LF, the phase axial processing data D11 is suitably filtered.

In a manner similar to the above, phase axial processing data D12 and D13 are also displaced in the k space, based on the displacement $F_{D04}$, thereby executing centering processing thereon. Since the peaks of the phase axial processing data D12 and D13 pass through the homodyne high pass filter HF and homodyne low pass filter LF lying in the frequency axial center O in the k space even in this case, the phase axial processing data D12 and D113 are suitably filtered.

In the eighth embodiment of the invention as described above, the maximum values of signal intensities at respective frequency axial processing data calculated by executing, in a frequency-axis direction, FFT processing on all echo signals received by a plurality of surface coils are calculated. The differences between the frequencies at which the signal intensities at the respective frequency axial processing data become maximum, and the frequency at a frequency axial center O in a k space are calculated. The standard deviations of the frequency differences at the frequency axial processing data at all channels are calculated. The corresponding frequency difference is selected out of the frequency differences at the frequency axial processing data at all the channels. The average value of the selected frequency difference is set as a displacement for displacing all frequency axial processing data. Each phase axial processing data is displaced based on the calculated displacement thereby to execute centering processing. Half echo processing is executed on the data subjected to the centering processing thereby to generate an image.

Thus, each frequency difference is selected based on the standard deviations of the frequency differences at the frequency axial processing data at all channels, so that frequency differences extremely different in value can be eliminated from the frequency differences for calculating the average value. Therefore, artifacts of a generated image can be prevented by displacing all phase axial processing data in the k space, based on the average value of the frequency difference selected based on the standard deviations. Thus, image quality can be enhanced.

Incidentally, the echo signals employed in the present embodiment referred to above correspond to the magnetic resonance signals of the invention. The reference frequency axial processing data of the present embodiment corresponds to the reference magnetic resonance signal of the invention. The scan section 2 of the present embodiment corresponds to the scan section of the invention. The displacement calculating part 301 of the present embodiment corresponds to the displacement calculating part of the invention. The centering executing part 302 of the present embodiment corresponds to the centering executing part of the invention. The image reconstruction unit 33 of the invention corresponds to the image reconstruction unit of the invention.

Upon implementation of the invention, the invention is not limited to the above embodiments. Various modifications can be adopted.

Although centering processing is executed on data obtained by executing FFT processing on echo signals in the embodiment of the invention, the invention is not limited to it. FFT processing may be executed on data obtained by executing centering processing on the echo signals. Although centering processing is executed based on the average value of the products of integral values and frequency differences in the fifth embodiment of the invention, the invention is not limited to it. The centering processing may be executed based on the average value of the product of both a profile characteristic of each echo signal and a frequency difference. For example, the profile characteristic of the echo signal may be taken as the average value of the entire echo signal profile characteristic. The profile characteristic may be a profile characteristic of other echo signal.

Many widely different embodiments of the invention may be configured without departing from the spirit and the scope of the present invention. It should be understood that the present invention is not limited to the specific embodiments described in the specification, except as defined in the appended claims.

What is claimed is:

1. A method for generating an image based on a plurality of magnetic resonance signals received and obtained by a plurality of RF coils by scanning a subject lying within a static magnetic field space by the RF coils in accordance with a parallel imaging method, said method comprising:
providing a controller communicatively coupled to the plurality of RF coils, the controller performing the following steps:
selecting a reference magnetic resonance signal used as a reference from the magnetic resonance signals based on profiles of the magnetic resonance signals;
calculating a frequency difference corresponding to a difference between a frequency maximum in signal intensity at the reference magnetic resonance signal and a frequency at a center of a k space;
setting the frequency difference as a displacement for displacing all the magnetic resonance signals;
displacing the magnetic resonance signals based on the frequency difference; and
executing half echo processing on the displaced magnetic resonance signals to generate the image.

2. The method according to claim 1, wherein selecting a reference magnetic resonance signal comprises:
calculating a maximum value of signal intensities of the magnetic resonance signals; and
selecting the magnetic resonance signal largest in the maximum value within all the magnetic resonance signals as the reference magnetic resonance signal.

3. A method for generating an image based on a plurality of magnetic resonance signals received and obtained by a plurality of RF coils by scanning a subject lying within a static magnetic field space by the RF coils in accordance with a parallel imaging method, said method comprising:
providing a controller communicatively coupled to the plurality of RF coils, the controller performing the following steps:
calculating a frequency difference corresponding to differences between frequencies maximum in signal intensity with respect to the magnetic resonance signals and a frequency at a center of a k space;
calculating an average value of the frequency differences;
setting the average value of the frequency differences as a displacement for displacing all the magnetic resonance signals;
displacing the magnetic resonance signals based on the average value; and
executing half echo processing on the displaced magnetic resonance signals to generate the image.

4. A method for generating an image based on a plurality of magnetic resonance signals received and obtained by a plurality of RF coils by scanning a subject lying within a static magnetic field space by the RF coils in accordance with a parallel imaging method, said method comprising:
  providing a controller communicatively coupled to the plurality of RF coils, the controller performing the following steps:
    calculating profile characteristics of the magnetic resonance signals and differences between frequencies maximum in signal intensity with respect to the magnetic resonance signals and a frequency at a center of a k space;
    calculating an average value of the products of the frequency differences and the profile characteristics;
    setting the average value as a displacement for displacing all the magnetic resonance signals;
    displacing the magnetic resonance signals based on the average value; and
    executing half echo processing on the displaced magnetic resonance signals to generate the image.

5. A method for generating an image based on a plurality of magnetic resonance signals received and obtained by a plurality of RF coils by scanning a subject lying within a static magnetic field space by the RF coils in accordance with a parallel imaging method, said method comprising:
  providing a controller communicatively coupled to the plurality of RF coils, the controller performing the following steps:
    calculating frequency differences between frequencies maximum in signal intensity with respect to the magnetic resonance signals and a frequency at a center of a k space;
    setting the frequency differences as displacements for displacing median values of the frequency differences;
    displacing the magnetic resonance signals based on the frequency differences; and
    executing half echo processing on the displaced magnetic resonance signals to generate the image.

6. A method for generating an image based on a plurality of magnetic resonance signals received and obtained by a plurality of RF coils by scanning a subject lying within a static magnetic field space by the RF coils in accordance with a parallel imaging method, said method comprising:
  providing a controller communicatively coupled to the plurality of RF coils, the controller performing the following steps:
    calculating frequency differences between frequencies maximum in signal intensity with respect to the magnetic resonance signals and a frequency at a center of a k space;
    calculating standard deviations of the frequency differences;
    selecting a plurality of reference frequency differences each set as a reference from the frequency differences calculated with respect to the magnetic resonance signals based on the standard deviations;
    calculating an average value of the selected reference frequency differences;
    setting the average value as a displacement for displacing all the magnetic resonance signals;
    displacing the magnetic resonance signals based on the average value;
    executing half echo processing on the displaced magnetic resonance signals to generate the image.

7. A position correcting method for displacing a plurality of magnetic resonance signals respectively received and obtained by a plurality of RF coils by scanning a subject lying within a static magnetic field space by the RF coils in accordance with a parallel imaging method, said position correcting method being suitable for use in a method for executing half echo processing on the magnetic resonance signals thereby to generate an image, said position correcting method comprising:
  providing a controller communicatively coupled to the plurality of RF coils, the controller performing the following steps:
    selecting a reference magnetic resonance signal used as a reference from the magnetic resonance signals based on profiles of the magnetic resonance signals;
    calculating a frequency difference corresponding to a difference between a frequency maximum in signal intensity at the reference magnetic resonance signal and a frequency at a center of a k space;
    setting the frequency difference as a displacement for displacing all the magnetic resonance signals; and
    displacing the magnetic resonance signals based on the frequency difference.

8. A position correcting method for displacing a plurality of magnetic resonance signals respectively received and obtained by a plurality of RF coils by scanning a subject lying within a static magnetic field space by the RF coils in accordance with a parallel imaging method, said position correcting method being suitable for use in a method for executing half echo processing on the magnetic resonance signals thereby to generate an image, said position correcting method comprising:
  providing a controller communicatively coupled to the plurality of RF coils, the controller performing the following steps:
    calculating frequency differences corresponding to differences between frequencies maximum in signal intensity with respect to the magnetic resonance signals and a frequency at a center of a k space;
    calculating an average value of the frequency differences;
    setting the average value as a displacement for displacing all the magnetic resonance signals; and
    displacing the magnetic resonance signals based on the average value.

9. A position correcting method for displacing a plurality of magnetic resonance signals respectively received and obtained by a plurality of RF coils by scanning a subject lying within a static magnetic field space by the RF coils in accordance with a parallel imaging method, said position correcting method being suitable for use in a method for executing half echo processing on the magnetic resonance signals thereby to generate an image, said position correcting method comprising:
  providing a controller communicatively coupled to the plurality of RF coils, the controller performing the following steps:
    calculating frequency differences between frequencies maximum in signal intensity with respect to the magnetic resonance signals and a frequency at a center of a k space, and
    calculating profile characteristics of the magnetic resonance and signals;
    calculating an average value of the products of the frequency differences and the profile characteristics;
    setting the average value as a displacement for displacing all the magnetic resonance signals; and
    displacing the magnetic resonance signals based on the average value.

10. A position correcting method for displacing a plurality of magnetic resonance signals respectively received and obtained by a plurality of RF coils by scanning a subject lying within a static magnetic field space by the RF coils in accordance with a parallel imaging method, said position correcting method being suitable for use in a method for executing half echo processing on the magnetic resonance signals thereby to generate an image, said position correcting method comprising:

providing a controller communicatively coupled to the plurality of RF coils, the controller performing the following steps:

calculating frequency differences between frequencies maximum in signal intensity with respect to the magnetic resonance signals and a frequency at a center of a k space;

setting the frequency differences as displacements for displacing median values of the frequency differences; and displacing the magnetic resonance signals based on the frequency differences.

11. A position correcting method for displacing a plurality of magnetic resonance signals respectively received and obtained by a plurality of RF coils by scanning a subject lying within a static magnetic field space by the RF coils in accordance with a parallel imaging method, said position correcting method being suitable for use in a method for executing half echo processing on the magnetic resonance signals thereby to generate an image, said position correcting method comprising:

providing a controller communicatively coupled to the plurality of RF coils, the controller performing the following steps:

calculating frequency differences between frequencies maximum in signal intensity with respect to the magnetic resonance signals and a frequency at a center of a k space;

calculating standard deviations of the frequency differences;

selecting a plurality of reference frequency differences each set as a reference from the frequency differences calculated with respect to the magnetic resonance signals based on the standard deviations;

calculating an average value of the selected reference frequency differences; and setting the average value as a displacement for displacing all the magnetic resonance signals; and displacing the magnetic resonance signals based on the average value.

12. A magnetic resonance imaging apparatus configured to generate an image based on a plurality of magnetic resonance signals received and obtained by a plurality of RF coils by scanning a subject lying within a static magnetic field space by the RF coils in accordance with a parallel imaging method, said magnetic resonance imaging apparatus comprising:

a scan section configured to apply RF pulses to the subject and to receive the magnetic resonance signals;

a displacement calculating part configured to:

select a reference magnetic resonance signal used as a reference from the magnetic resonance signals received by aid scan section based on profiles of the magnetic resonance signals;

calculate a frequency difference corresponding to a difference between a frequency maximum in signal intensity at the selected reference magnetic resonance signal and a frequency at a center of a k space; and set the frequency difference as a displacement for displacing the magnetic resonance signals;

a centering executing part configured to displace the magnetic resonance signals based on the frequency difference calculated by said displacement calculating part to execute centering processing; and an image reconstruction unit configured to execute half echo processing on the magnetic resonance signals displaced by said centering executing part to generate an image.

13. The magnetic resonance imaging apparatus according to claim 12, wherein said displacement calculating part is configured to:

calculate a maximum value of signal intensities of the magnetic resonance signals received by said san section;

select the magnetic resonance signal largest in the maximum value within the magnetic resonance signals as the reference magnetic resonance signal;

calculate a frequency difference corresponding to a difference between a frequency maximum in signal intensity at the selected reference magnetic resonance signal and a frequency at the center of a k space; and set the frequency difference as a displacement for displacing all the magnetic resonance signals.

14. The magnetic resonance imaging apparatus according to claim 12, wherein said displacement calculating part is configured to:

calculate each of integral values of the magnetic resonance signals received by the scan section;

select the magnetic resonance signal maximum in the integral value within the magnetic resonance signals as the reference magnetic resonance signal;

calculate a frequency difference corresponding to a difference between a frequency maximum in signal intensity at the selected reference magnetic resonance signal and a frequency at the center of a k space; and set the frequency difference as a displacement for displacing all the magnetic resonance signals.

15. The magnetic resonance imaging apparatus according to claim 12, wherein said displacement calculating part is configured to:

calculate correlation coefficients between the magnetic resonance signals with respect to the magnetic resonance signals received by the scan section;

select the magnetic resonance signal maximum in the average value of the correlation coefficients calculated every said magnetic resonance signals within all the magnetic resonance signals as the reference magnetic resonance signal;

calculate a frequency difference corresponding to a difference between a frequency maximum in signal intensity at the selected reference magnetic resonance signal and a frequency at a center of a k space; and set the frequency difference as a displacement for displacing all the magnetic resonance signals.

16. The magnetic resonance imaging apparatus according to claim 12, wherein said displacement calculating part is configured to:

calculate frequency differences corresponding to differences between frequencies maximum in signal intensity with respect to the magnetic resonance signals received by the scan section and a frequency at the center of a k space;

calculate an average value of the frequency differences; and set the average value thereof as a displacement for displacing all the magnetic resonance signals.

17. The magnetic resonance imaging apparatus according to claim 12, wherein said displacement calculating part is configured to:
  calculate frequency differences between frequencies maximum in signal intensity with respect to the magnetic resonance signals received by the scan section and a frequency at the center of a k space
  calculate integral values of the magnetic resonance signals;
  calculate an average value of the products of the frequency differences and the integral values; and
  set the average value thereof as a displacement for displacing all the magnetic resonance signals.

18. The magnetic resonance imaging apparatus according to claim 12, wherein said displacement calculating part is configured to:
  calculate frequency differences between frequencies maximum in signal intensity with respect to the magnetic resonance signals received by the scan section and a frequency at the center of a k space;
  calculate maximum values of signal intensities of the magnetic resonance signals;
  calculate an average value of the products of the frequency differences and the maximum values of the signal intensities; and
  set the average value thereof as a displacement for displacing all the magnetic resonance signals.

19. The magnetic resonance imaging apparatus according to claim 12, wherein said displacement calculating part is configured to:
  calculate a frequency difference between a frequency maximum in signal intensity with respect to the magnetic resonance signals received by the scan section and a frequency at the center of a k space; and
  set the same as a displacement for displacing a median value of the frequency difference.

20. The magnetic resonance imaging apparatus according to claim 12, wherein said displacement calculating part is configured to:
  calculate frequency differences between frequencies maximum in signal intensity with respect to the magnetic resonance signals received by the scan section and a frequency at the center of a k space;
  calculate standard deviations of the frequency differences;
  select a plurality of reference frequency differences each set as a reference from the frequency differences calculated with respect to the magnetic resonance signals based on the standard deviations,
  calculate an average value of the selected reference frequency differences; and
  set the average value thereof as a displacement for displacing all the magnetic resonance signals.

* * * * *